US012744146B2

(12) United States Patent
Motoyama et al.

(10) Patent No.: US 12,744,146 B2

(45) Date of Patent: Sep. 22, 2026

(54) LC FILTER, MULTIPLEXER, HIGH FREQUENCY MODULE, AND COMMUNICATION DEVICE

(71) Applicant: Murata Manufacturing Co., Ltd., Nagaokakyo (JP)

(72) Inventors: Hiroto Motoyama, Nagaokakyo (JP); Akira Tanaka, Nagaokakyo (JP); Mitsutoshi Imamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 271 days.

(21) Appl. No.: 18/762,906

(22) Filed: Jul. 3, 2024

(65) Prior Publication Data

US 2024/0363277 A1 Oct. 31, 2024

Related U.S. Application Data

(63) Continuation of application No. PCT/JP2023/000857, filed on Jan. 13, 2023.

(30) Foreign Application Priority Data

Jan. 28, 2022 (JP) ................................ 2022-012134
Mar. 30, 2022 (JP) ................................ 2022-057720

(51) Int. Cl.

*H01F 17/00* (2006.01)
*H03H 7/01* (2006.01)
*H03H 1/00* (2006.01)

(52) U.S. Cl.

CPC ....... *H01F 17/0013* (2013.01); *H03H 7/1741* (2013.01); *H01F 2017/0026* (2013.01); *H03H 1/0007* (2013.01); *H03H 2001/0085* (2013.01)

(58) Field of Classification Search

CPC ...... H01F 17/0013; H01F 17/00; H01F 27/00; H01F 2017/0026; H01G 4/40; H01P 1/20;

(Continued)

(56) References Cited

U.S. PATENT DOCUMENTS 10,461,716 B2 * 10/2019 Kitami .................... H03H 1/00
2003/0043759 A1 3/2003 Yamaguchi (Continued)

FOREIGN PATENT DOCUMENTS

JP 2003158437 A 5/2003
JP 2018186417 A 11/2018

(Continued)

OTHER PUBLICATIONS

International Search Report in PCT/JP2023/000857, mailed Apr. 4, 2023, 5 pages.

(Continued)

*Primary Examiner* — Quan Tra

(74) *Attorney, Agent, or Firm* — Keating & Bennett, LLP

(57) ABSTRACT

In an LC filter, a first inductor via, a second inductor via, and a third inductor via define a first inductor, a second inductor, and a third inductor, respectively. A first inductor pattern portion defines a fourth inductor. The first inductor pattern portion is connected to at least one of a first electrode, the first inductor via, and a first capacitor electrode, and a first input/output port. The first capacitor electrode and the third capacitor electrode do not face each other.

30 Claims, 23 Drawing Sheets

(58) Field of Classification Search
CPC ...... H03H 7/01; H03H 7/0115; H03H 7/1741; H03H 7/46; H03H 1/0007; H03H 2001/0085
See application file for complete search history.

(56) References Cited

U.S. PATENT DOCUMENTS

| | | | | |
|---|---|---|---|---|
| 2017/0170798 | A1* | 6/2017 | Masuda | H03H 7/1708 |
| 2018/0316330 | A1 | 11/2018 | Kitami et al. | |
| 2022/0077836 | A1* | 3/2022 | Motoyama | H03H 7/1758 |
| 2023/0029621 | A1 | 2/2023 | Motoyama | |
| 2023/0044859 | A1* | 2/2023 | Motoyama | H03H 7/0115 |
| 2023/0353116 | A1* | 11/2023 | Sato | H01F 17/0013 |

FOREIGN PATENT DOCUMENTS

| | | | |
|---|---|---|---|
| JP | 2021150840 | A | 9/2021 |
| WO | 2016152205 | A1 | 9/2016 |
| WO | 2021241104 | A1 | 12/2021 |

OTHER PUBLICATIONS

Written Opinion in PCT/JP2023/000857, mailed Apr. 4, 2023, 6 pages.

* cited by examiner

V3 (V0)
V31 V32
V33 V34
V2 (V0)
V21 V22
1C
32
32
22
22
P1
V1 (V0)
201
2
PC3 (PC0)
31
P51
V52
P52
12
21
21
PL2
PC22
PC21
P41
P42
11
D1
PC2 (PC0)
V42
V43
3
PL1
PC1 (PC0)
V41
3
GND (3)
D3
202
P2
3
T1 (3)
D2

LC FILTER, MULTIPLEXER, HIGH FREQUENCY MODULE, AND COMMUNICATION DEVICE

CROSS REFERENCE TO RELATED APPLICATIONS

This application claims the benefit of priority to Japanese Patent Application No. 2022-057720 filed on Mar. 30, 2022 and Japanese Patent Application No. 2022-012134 filed on Jan. 28, 2022, and is a Continuation Application of PCT Application No. PCT/JP2023/000857 filed on Jan. 13, 2023. The entire contents of each application are hereby incorporated herein by reference.

BACKGROUND OF THE INVENTION

1. Field of the Invention

The present invention relates to LC filters, multiplexers, high frequency modules, and communication devices, and more specifically, to LC filters each including a plurality of capacitor electrodes and a plurality of inductor vias, multiplexers including the LC filters, high frequency modules including the LC filters, and communication devices including the high frequency modules.

2. Description of the Related Art

International Publication No. 2021/241104 describes an LC filter. The LC filter described in International Publication No. 2021/241104 includes a multilayer body, a first electrode and a second electrode which have a plate shape, and a first capacitor electrode, a second capacitor electrode, and a third capacitor electrode. The multilayer body is formed by laminating a plurality of dielectric layers. The first capacitor electrode, the second capacitor electrode, and the third capacitor electrode form a capacitor with the second electrode. The LC filter described in International Publication No. 2021/241104 further includes a capacitor electrode facing the first capacitor electrode and the third capacitor electrode.

Meanwhile, in the LC filter in the related art described in International Publication No. 2021/241104, since the capacitor electrode facing the first capacitor electrode and the third capacitor electrode is provided, the attenuation in the high frequency band cannot be sufficiently obtained in some cases.

SUMMARY OF THE INVENTION

Example embodiments of the present invention provide LC filters, multiplexers, high frequency modules, and communication devices which are each able to improve a loss of a signal in a pass band and improve attenuation characteristics in a non-pass band including a high frequency band.

An example embodiment of the present invention provides an LC filter including a multilayer body, a first input/output port, a second input/output port, a first electrode, a second electrode, a first capacitor electrode, a second capacitor electrode, a third capacitor electrode, a first inductor via, a second inductor via, a third inductor via, and a first inductor pattern portion. In the multilayer body, a plurality of dielectric layers are laminated. The first input/output port is provided in the multilayer body. The second input/output port is provided in the multilayer body and is different from the first input/output port. The first electrode has a plate shape and is provided in a first dielectric layer among the plurality of dielectric layers. The second electrode has a plate shape and is provided in a second dielectric layer different from the first dielectric layer among the plurality of dielectric layers. The first capacitor electrode defines a first capacitor with the second electrode. The second capacitor electrode defines a second capacitor with the second electrode. The third capacitor electrode defines a third capacitor with the second electrode. The first inductor via includes a first end connected to the first capacitor electrode and a second end connected to the first electrode, and defines a first inductor. The second inductor via includes a third end connected to the second capacitor electrode and a fourth end connected to the first electrode, and defines a second inductor. The third inductor via includes a fifth end connected to the third capacitor electrode and a sixth end connected to the first electrode, and defines a third inductor. The first inductor pattern portion defines a fourth inductor. The first capacitor electrode and the second capacitor electrode define a fourth capacitor. The second capacitor electrode and the third capacitor electrode define a fifth capacitor. The first inductor pattern portion includes a first end connected to at least one of the first electrode, the first inductor via, and the first capacitor electrode, and a second end connected to the first input/output port. The first capacitor electrode and the third capacitor electrode do not face each other.

An example embodiment of the present invention provides a multiplexer including a first filter including an LC filter according to an example embodiment of the present invention, and a second filter. The second filter allows a signal in a frequency band higher than a pass band of the first filter to pass through the second filter.

An example embodiment of the present invention provides a high frequency module including a filter including an LC filter according to an example embodiment of the present invention, and an amplifier.

An example embodiment of the present invention provides a communication device including a high frequency module according to an example embodiment of the present invention, and a signal processing circuit.

An example embodiment of the present invention provides a multiplexer including a first filter, a second filter, and a multilayer body. The first filter is a low pass filter. The second filter allows a signal in a frequency band higher than a pass band of the first filter to pass through the second filter. In the multilayer body, a plurality of dielectric layers are laminated. The first filter includes a first electrode, a second electrode, a first capacitor electrode, a second capacitor electrode, a third capacitor electrode, a first inductor via, a second inductor via, a third inductor via, and a first inductor pattern portion. The first electrode is provided in a first dielectric layer among the plurality of dielectric layers. The second electrode is provided in a second dielectric layer different from the first dielectric layer among the plurality of dielectric layers, and is a ground electrode. The first capacitor electrode defines a first capacitor with the second electrode. The second capacitor electrode defines a second capacitor with the second electrode. The third capacitor electrode defines a third capacitor with the second electrode. The first inductor via includes a first end connected to the first capacitor electrode and a second end connected to the first electrode, and defines a first inductor. The second inductor via includes a third end connected to the second capacitor electrode and a fourth end connected to the first electrode, and defines a second inductor. The third inductor via includes a fifth end connected to the third capacitor electrode and a sixth end connected to the first electrode, and defines a third inductor. The first inductor pattern portion defines a fourth inductor. The second filter includes a first electrode for the second filter, a second electrode for the second filter, a first capacitor electrode for the second filter, a second capacitor electrode for the second filter, a third capacitor electrode for the second filter, a first inductor via for the second filter, a second inductor via for the second filter, a third inductor via for the second filter, a fourth inductor via for the second filter, a fifth inductor via for the second filter, and a sixth inductor via for the second filter. The first electrode for the second filter is provided in a first dielectric layer among the plurality of dielectric layers. The second electrode for the second filter is provided in a second dielectric layer different from the first dielectric layer among the plurality of dielectric layers, and is a ground electrode. The first capacitor electrode for the second filter defines a first capacitor for the second filter with the second electrode for the second filter. The second capacitor electrode for the second filter defines a second capacitor for the second filter with the second electrode for the second filter. The third capacitor electrode for the second filter defines a third capacitor for the second filter with the second electrode for the second filter. The first inductor via for the second filter is connected between the first capacitor electrode for the second filter and the first electrode for the second filter, and defines a first inductor for the second filter. The second inductor via for the second filter is connected between the second capacitor electrode for the second filter and the first electrode for the second filter, and defines a second inductor for the second filter. The third inductor via for the second filter is connected between the third capacitor electrode for the second filter and the first electrode for the second filter, and defines a third inductor for the second filter. The fourth inductor via for the second filter is connected between the first electrode for the second filter and the second electrode for the second filter, and defines a fourth inductor for the second filter connected in series to the first inductor for the second filter. The fifth inductor via for the second filter is connected between the first electrode for the second filter and the second electrode for the second filter, and defines a fifth inductor for the second filter connected in series to the second inductor for the second filter. The sixth inductor via for the second filter is connected between the first electrode for the second filter and the second electrode for the second filter, and defines a sixth inductor for the second filter connected in series to the third inductor for the second filter. At least one of the fourth inductor via for the second filter, the fifth inductor via for the second filter, and the sixth inductor via for the second filter is disposed in a boundary region between the first filter and the second filter.

With LC filters, multiplexers, high frequency modules, and communication devices according to example embodiments of the present invention, it is possible to improve loss with respect to a signal in a pass band and to improve attenuation characteristics in a non-pass band including a high frequency band.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
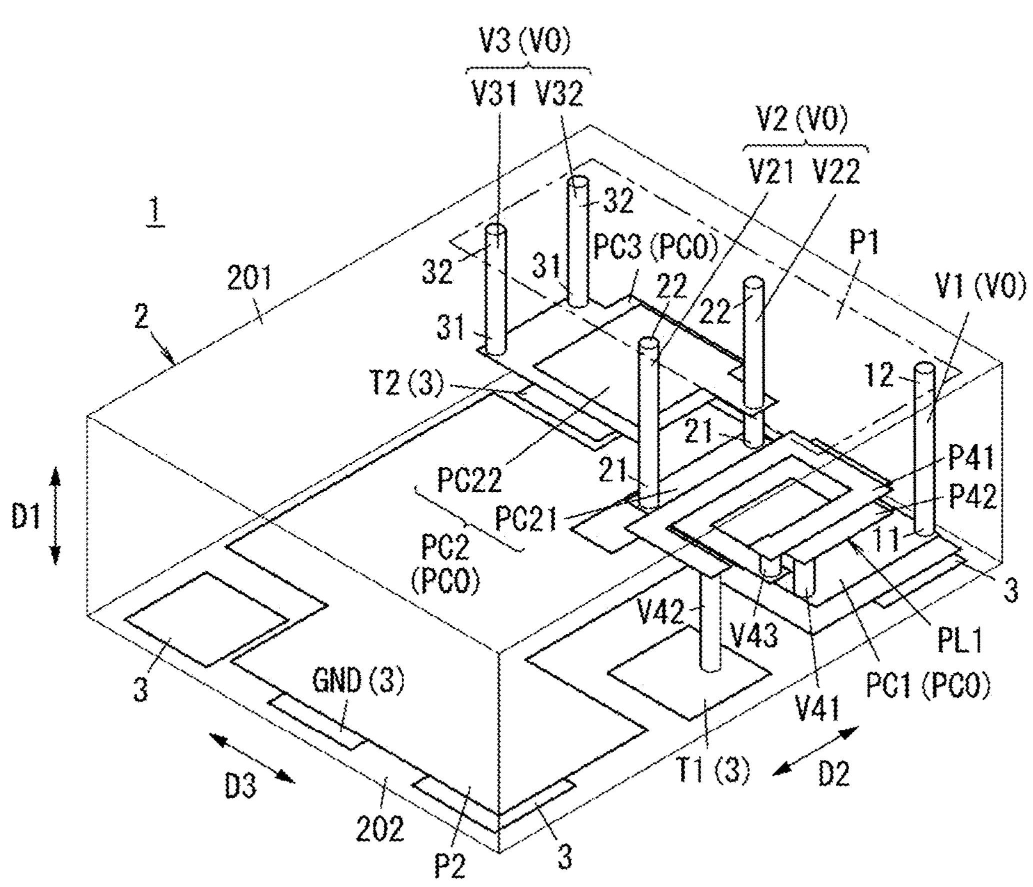
FIG. 1 is a transparent perspective view of an LC filter according to Example Embodiment 1 of the present invention.

Hereinafter, LC filters according to Example Embodiments 1 to 4, multiplexers according to Example Embodiments 5 and 7 to 12, and high frequency modules and communication devices according to Example Embodiment 6 will be described with reference to the drawings. The drawings referred to in the following example embodiments and the like are schematic diagrams, and the ratios of the sizes or the thicknesses of the respective components in the drawings do not necessarily reflect the actual dimensional ratios.

In the following description, a lamination direction in a multilayer body 2 described later (a lamination direction of a plurality of dielectric layers in the multilayer body 2) is defined as a "first direction D1", a direction that is orthogonal or substantially orthogonal to the first direction D1 and is along one side of the multilayer body 2 is defined as a "second direction D2", and a direction along the other side of the multilayer body 2 is defined as a "third direction D3".

In FIGS. 1 to 3, 6 to 8, 10 to 12, 15 to 17, 22 to 24, 26, 27, 29, and 30, the dielectric layers of the multilayer body 2 are not illustrated, and only conductors of a wiring pattern portion, a via, and a terminal formed inside the dielectric layers are illustrated.

Example Embodiment 1

(1) Overall Structure of LC Filter

A structure of a LC filter 1 according to Example Embodiment 1 will be described with reference to the drawings. The LC filter 1 according to Example Embodiment 1 is a low pass filter that allows a signal in a frequency band lower than a specific frequency to pass therethrough.

(2) Each Component of LC Filter

Hereinafter, each component of the LC filter 1 according to Example Embodiment 1 will be described with reference to the drawings.

Figure 2:
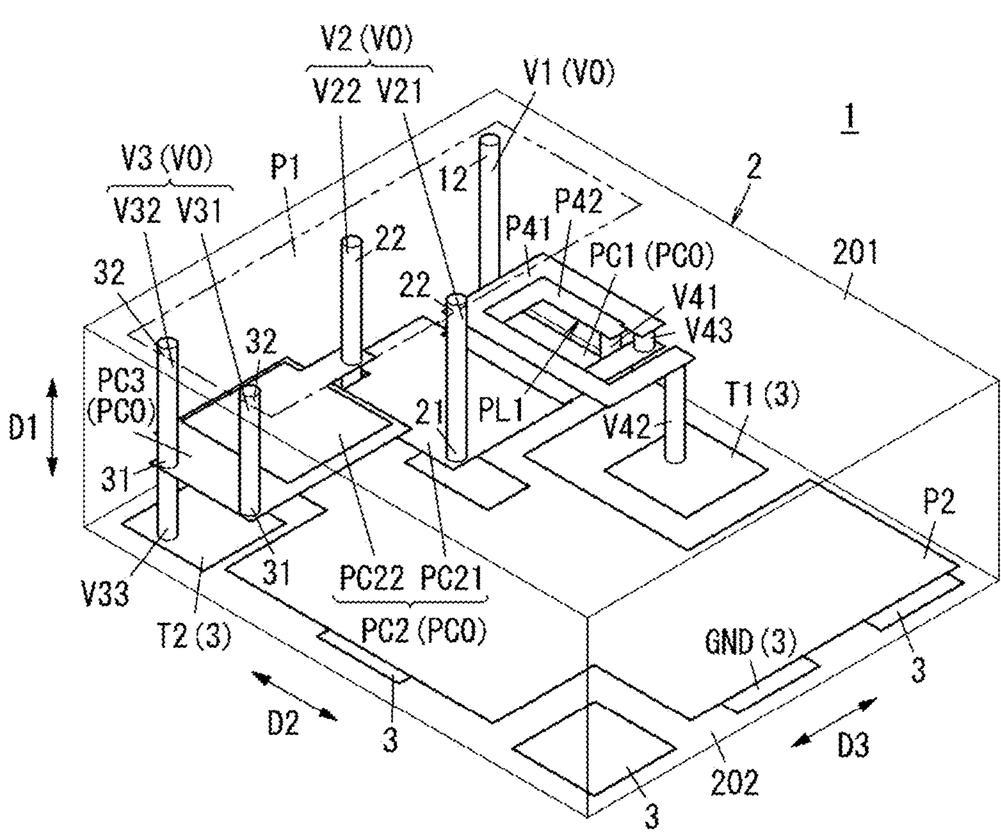
FIG. 2 is a transparent perspective view of the LC filter of FIG. 1.
Figure 3:
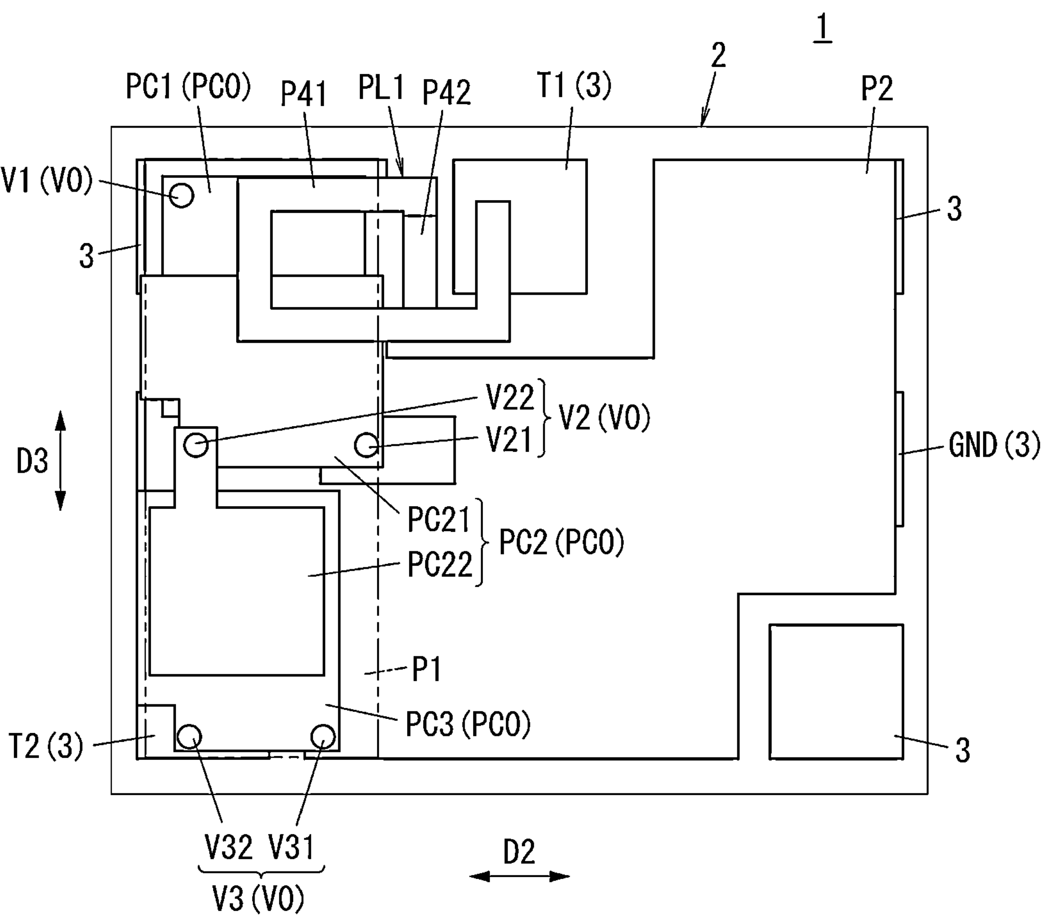
FIG. 3 is a transparent plan view of the LC filter of FIG. 1.

As illustrated in FIGS. 1 to 3, the LC filter 1 includes the multilayer body 2, a plurality of terminals 3, a first electrode P1, a second electrode P2, a plurality of capacitor electrodes PC0, and a plurality of inductor vias V0.

(2.1) Multilayer Body

As illustrated in FIGS. 1 to 3, the multilayer body 2 is a rectangular parallelepiped or a substantially rectangular parallelepiped, and is formed by laminating a plurality of dielectric layers (not illustrated) in the lamination direction. That is, the multilayer body 2 is a structure in which a plurality of dielectric layers are laminated. Each of the plurality of dielectric layers of the multilayer body 2 is made of, for example, a ceramic. An inductor and a capacitor include a plurality of wiring pattern portions, a plurality of electrodes, and a plurality of vias (via conductors) provided in the dielectric layers inside the multilayer body 2. The multilayer body 2 is not limited to the rectangular parallelepiped or the substantially rectangular parallelepiped, and may be a solid having another shape.

The multilayer body 2 includes a first main surface 201 and a second main surface 202. The second electrode P2 is provided in a second dielectric layer (not illustrated) close to the second main surface 202 of the multilayer body 2. In addition, the first electrode P1 is provided in a first dielectric layer (not illustrated) close to the first main surface 201 of the multilayer body 2. In FIGS. 1 to 3, the first electrode P1 is illustrated by a double-dotted chain line.

(2.2) Terminal

The plurality of terminals 3 (input terminal T1, output terminal T2, and ground terminal GND) are electrodes having a plate shape, and are provided in the multilayer body 2. More specifically, the plurality of terminals 3 are disposed on the second main surface 202 of the multilayer body 2. The plurality of terminals 3 are, for example, land grid array (LGA) terminals regularly disposed on the second main surface 202 of the multilayer body 2. The plurality of terminals 3 are external terminals to connect the LC filter 1 and an external device (not illustrated).

The plurality of terminals 3 include the input terminal T1 (first input/output port) and the output terminal T2 (second input/output port). The input terminal T1 is connected to a first capacitor electrode PC1. The output terminal T2 is connected to a third capacitor electrode PC3. In addition, the plurality of terminals 3 include the ground terminal GND. The ground terminal GND has a ground potential.

(2.3) First Electrode and Second Electrode

As illustrated in FIGS. 1 to 3, the first electrode P1 is provided in the first dielectric layer (not illustrated) among the plurality of dielectric layers of the multilayer body 2. The first electrode P1 is a plate electrode having a plate shape. In plan view in the lamination direction (first direction D1) of the multilayer body 2, the first electrode P1 has a rectangular or substantially rectangular shape.

The second electrode P2 is provided in the second dielectric layer (not illustrated) different from the first dielectric layer among the plurality of dielectric layers of the multilayer body 2. The second electrode P2 is a plate electrode having a plate shape. The second electrode P2 is connected to the ground terminal GND. More specifically, the second electrode P2 is connected to the ground terminal GND disposed on the second main surface 202 of the multilayer body 2 with a via (not illustrated) interposed therebetween.

(2.4) Capacitor Electrode

As illustrated in FIGS. 1 to 3, the LC filter 1 includes the first capacitor electrode PC1, the second capacitor electrode PC2, and the third capacitor electrode PC3, as the plurality of capacitor electrodes PC0.

The first capacitor electrode PC1 has a plate shape, and is provided in the dielectric layer (not illustrated) between the first electrode P1 and the second electrode P2 in the first direction D1. The first capacitor electrode PC1 is spaced apart from the second electrode P2, and defines a first capacitor C1 (see FIG. 4) with the second electrode P2. The first capacitor electrode PC1 is connected to a first inductor pattern portion PL1.

The second capacitor electrode PC2 has a plate shape, and is provided in the dielectric layer (not illustrated) between the first electrode P1 and the second electrode P2 in the first direction D1. More specifically, the second capacitor electrode PC2 includes a first portion PC21 and a second portion PC22. The second capacitor electrode PC2 is spaced apart from the second electrode P2, and defines a second capacitor C2 (see FIG. 4) with the second electrode P2.

The third capacitor electrode PC3 has a plate shape, and is provided in the dielectric layer (not illustrated) between the first electrode P1 and the second electrode P2 in the first direction D1. The third capacitor electrode PC3 is spaced apart from the second electrode P2, and defines a third capacitor C3 (see FIG. 4) with the second electrode P2. The third capacitor electrode PC3 is connected to the output terminal T2 with a via conductor V33 interposed therebetween.

Figure 4:
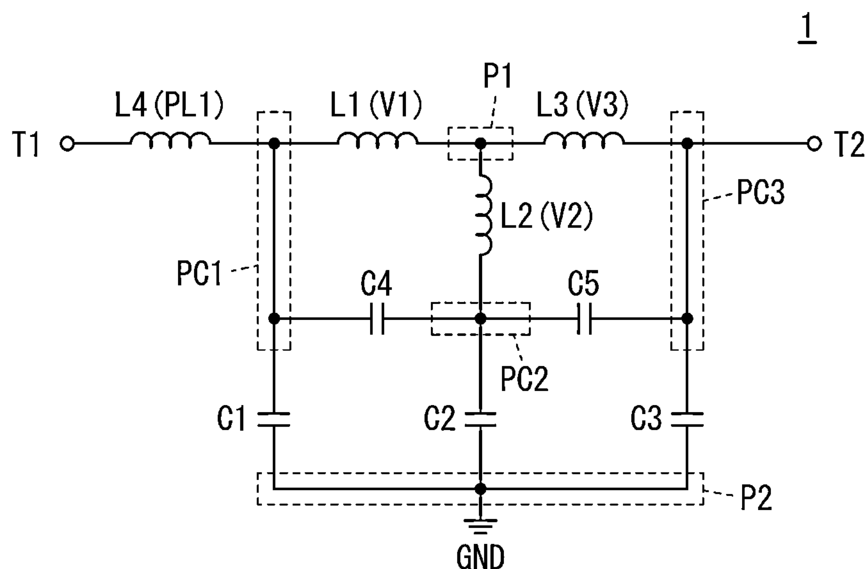
FIG. 4 is a circuit diagram of the LC filter of FIG. 1.

The first capacitor electrode PC1 and the second capacitor electrode PC2 define a fourth capacitor C4 (see FIG. 4). The second capacitor electrode PC2 and the third capacitor electrode PC3 define a fifth capacitor C5 (see FIG. 4). More specifically, the first portion PC21 of the second capacitor electrode PC2 and the first capacitor electrode PC1 define the fourth capacitor C4. The second portion PC22 of the second capacitor electrode PC2 and the third capacitor electrode PC3 define the fifth capacitor C5.

The first capacitor electrode PC1, the second capacitor electrode PC2, and the third capacitor electrode PC3 are provided between the first electrode P1 and the second electrode P2 in the lamination direction (first direction D1) of the multilayer body 2. In plan view in the lamination direction of the multilayer body 2, a portion of the first capacitor electrode PC1 may overlap with the first electrode P1 and the second electrode P2, or the entire or substantially the entire first capacitor electrode PC1 may overlap with the first electrode P1 and the second electrode P2. In other words, the first capacitor electrode PC1 is provided between the first electrode P1 and the second electrode P2 such that at least a portion of the first capacitor electrode PC1 overlaps with the first electrode P1 and the second electrode P2 in plan view in the lamination direction of the multilayer body 2. In addition, in plan view in the lamination direction of the multilayer body 2, a portion of the second capacitor electrode PC2 may overlap with the first electrode P1 and the second electrode P2, or the entire or substantially the entire second capacitor electrode PC2 may overlap with the first electrode P1 and the second electrode P2. In other words, the second capacitor electrode PC2 is provided between the first electrode P1 and the second electrode P2 such that at least a portion of the second capacitor electrode PC2 overlaps with the first electrode P1 and the second electrode P2 in plan view in the lamination direction of the multilayer body 2. Further, in plan view in the lamination direction of the multilayer body 2, a portion of the third capacitor electrode PC3 may overlap with the first electrode P1 and the second electrode P2, or the entire or substantially the entire third capacitor electrode PC3 may overlap with the first electrode P1 and the second electrode P2. In other words, the third capacitor electrode PC3 is provided between the first electrode P1 and the second electrode P2 such that at least a portion of the third capacitor electrode PC3 overlaps with the first electrode P1 and the second electrode P2 in plan view in the lamination direction of the multilayer body 2.

(2.5) Inductor Via

As illustrated in FIGS. 1 to 3, the LC filter 1 includes a first inductor via V1, a second inductor via V2, and a third inductor via V3, as the plurality of inductor vias V0.

The first inductor via V1 is connected between the first capacitor electrode PC1 and the first electrode P1. More specifically, the first inductor via V1 includes a first end 11 and a second end 12. The first end 11 of the first inductor via V1 is connected to the first capacitor electrode PC1. The second end 12 of the first inductor via V1 is connected to the first electrode P1. The first inductor via V1 defines a first inductor L1 (see FIG. 4).

The second inductor via V2 is connected between the second capacitor electrode PC2 and the first electrode P1. More specifically, the second inductor via V2 includes a third end 21 and a fourth end 22. The third end 21 of the second inductor via V2 is connected to the second capacitor electrode PC2. The fourth end 22 of the second inductor via V2 is connected to the first electrode P1. The second inductor via V2 defines a second inductor L2 (see FIG. 4). The second inductor via V2 includes a plurality of (in the illustrated example, two) via conductors V21 and V22 extending in the lamination direction (first direction D1) of the multilayer body 2. The plurality of via conductors V21 and V22 are connected in parallel between the second capacitor electrode PC2 and the first electrode P1. In addition, the plurality of via conductors V21 and V22 are arranged along the second direction D2.

The third inductor via V3 is connected between the third capacitor electrode PC3 and the first electrode P1. More specifically, the third inductor via V3 includes a fifth end 31 and a sixth end 32. The fifth end 31 of the third inductor via V3 is connected to the third capacitor electrode PC3. The sixth end 32 of the third inductor via V3 is connected to the first electrode P1. The third inductor via V3 defines a third inductor L3 (see FIG. 4). The third inductor via V3 includes a plurality of (in the illustrated example, two) via conductors V31 and V32 extending in the lamination direction (first direction D1) of the multilayer body 2. The plurality of via conductors V31 and V32 are connected in parallel between the third capacitor electrode PC3 and the first electrode P1. In addition, the plurality of via conductors V31 and V32 are arranged along the second direction D2.

Each of the first inductor via V1, the second inductor via V2, and the third inductor via V3 includes at least one via conductor.

The number of via conductors of each of the second inductor via V2 and the third inductor via V3 is larger than the number of via conductors of the first inductor via V1.

(2.6) Inductor Pattern Portion

As illustrated in FIGS. 1 to 3, the first inductor pattern portion PL1 includes a first end connected to at least one of the first electrode P1, the first inductor via V1, and the first capacitor electrode PC1, and includes a second end connected to the input terminal T1.

The first inductor pattern portion PL1 defines a fourth inductor L4 (see FIG. 4).

More specifically, the first inductor pattern portion PL1 includes a plurality of (in the illustrated example, two) pattern portions P41 and P42, plurality of (in the illustrated example, three) via conductors V41 to V43. The pattern portion P42 is connected to the first capacitor electrode PC1 with the via conductor V41 interposed therebetween. The pattern portion P41 is connected to the input terminal T1 with the via conductor V42 interposed therebetween. In addition, the pattern portion P41 and the pattern portion P42 are connected by the via conductor V43, and are arranged along the first direction D1. The via conductor V41 corresponds to the first end of the first inductor pattern portion PL1, and the via conductor V42 corresponds to the second end of the first inductor pattern portion PL1. The pattern portion P41 is provided in a wound state on a plane in one dielectric layer (not illustrated) among the plurality of dielectric layers of the multilayer body 2. The pattern portion P42 is provided in a wound state on a plane in one dielectric layer (not illustrated) different from the dielectric layer provided with the pattern portion P41 among the plurality of dielectric layers of the multilayer body 2.

As illustrated in FIGS. 1 to 3, in the LC filter 1, the first capacitor electrode PC1 and the third capacitor electrode PC3 do not face each other. Specifically, the LC filter 1 is not provided with a capacitor including the first capacitor electrode PC1 and the third capacitor electrode PC3. As a result, the fourth inductor L4 (see FIG. 4) including the first inductor pattern portion PL1 can improve a loss with respect to a signal in a pass band and can improve attenuation characteristics in a non-pass band including a high frequency band.

Meanwhile, an inductance of the first inductor pattern portion PL1 is larger than an inductance of each of the first inductor via V1, the second inductor via V2, and the third inductor via V3. As a result, since high frequency components can be reduced by the fourth inductor L4 (see FIG. 4) defined by the first inductor pattern portion PL1, the attenuation in the high frequency band can be further increased.

As described above, the first inductor pattern portion PL1 (pattern portions P41 and P42) is provided in a wound state on a plane in at least one of the plurality of dielectric layers (not illustrated) of the multilayer body 2. As a result, an inductance of the fourth inductor L4 can be easily increased as compared with the inductors (first inductor L1, second inductor L2, and third inductor L3) defined by the inductor via.

More specifically, the first inductor pattern portion PL1 according to Example Embodiment 1 is provided in a laminated and wound state in at least two of the plurality of dielectric layers. As a result, the inductance of the fourth inductor L4 can be further increased without increasing an area of the first inductor pattern portion PL1 on the plane. In other words, it is possible to increase the inductance of the fourth inductor L4 even in a case where the area in plan view in the lamination direction (first direction D1) of the multilayer body 2 is small, as compared with an inductor that is not in the laminated structure. The area of the first inductor pattern portion PL1 on the plane refers to an area of a region surrounded by an outer periphery of the first inductor pattern portion PL1 in plan view in the lamination direction (first direction D1) of the multilayer body 2. The outer periphery of the first inductor pattern portion PL1 refers to a line connecting outermost edges of the first inductor pattern portion PL1 in plan view in the lamination direction of the multilayer body 2.

The first inductor pattern portion PL1 is provided between the first electrode P1 and the second electrode P2 in the lamination direction (first direction D1) of the plurality of dielectric layers in the multilayer body 2. In plan view in the lamination direction of the multilayer body 2, a portion of the first inductor pattern portion PL1 may overlap with the first electrode P1 and the second electrode P2, or the entire or substantially the entire first inductor pattern portion PL1 may overlap with the first electrode P1 and the second electrode P2. In other words, the first inductor pattern portion PL1 is provided between the first electrode P1 and the second electrode P2 such that at least a portion of the first inductor pattern portion PL1 overlaps with the first electrode P1 and the second electrode P2 in plan view in the lamination direction of the multilayer body 2.

In particular, the first inductor pattern portion PL1 is provided between the first electrode P1 and the first capacitor electrode PC1 in the lamination direction (first direction D1) of the multilayer body 2. In plan view in the lamination direction of the multilayer body 2, a portion of the first inductor pattern portion PL1 may overlap with the first electrode P1 and the first capacitor electrode PC1, or the entire or substantially the entire first inductor pattern portion PL1 may overlap with the first electrode P1 and the first capacitor electrode PC1. In other words, the first inductor pattern portion PL1 is provided between the first electrode P1 and the first capacitor electrode PC1 such that at least a portion of the first inductor pattern portion PL1 overlaps with the first electrode P1 and the first capacitor electrode PC1 in plan view in the lamination direction of the multilayer body 2.

The second capacitor electrode PC2 includes the first portion PC21 and the second portion PC22. The first portion PC21 faces the first capacitor electrode PC1 in the lamination direction (first direction D1) of the multilayer body 2. The second portion PC22 faces the third capacitor electrode PC3 in the lamination direction (first direction D1) of the multilayer body 2.

The first inductor pattern portion PL1 is provided between the first electrode P1 and the first portion PC21 of the second capacitor electrode PC2 in the lamination direction (first direction D1) of the multilayer body 2. In plan view in the lamination direction of the multilayer body 2, a portion of the first inductor pattern portion PL1 may overlap with the first electrode P1 and the first portion PC21 of the second capacitor electrode PC2, or the entire or substantially the entire first inductor pattern portion PL1 may overlap with the first electrode P1 and the first portion PC21 of the second capacitor electrode PC2. In other words, the first inductor pattern portion PL1 is provided between the first electrode P1 and the first portion PC21 of the second capacitor electrode PC2 such that at least a portion of the first inductor pattern portion PL1 overlaps with the first electrode P1 and the first portion PC21 of the second capacitor electrode PC2 in plan view in the lamination direction of the multilayer body 2.

(3) Circuit Configuration of LC Filter

Next, a circuit configuration of the LC filter 1 will be described with reference to FIG. 4. In FIG. 4, connection portions illustrated by broken lines correspond to the first electrode P1, the second electrode P2, the first capacitor electrode PC1, the second capacitor electrode PC2, and the third capacitor electrode PC3 in FIGS. 1 to 3.

As illustrated in FIG. 4, the LC filter 1 includes the first capacitor C1, the second capacitor C2, the third capacitor C3, the fourth capacitor C4, the fifth capacitor C5, the first inductor L1, the second inductor L2, the third inductor L3, and the fourth inductor L4.

(3.1) First Capacitor and First Inductor

The first capacitor C1 is defined between the first capacitor electrode PC1 and the second electrode P2. The first capacitor C1 is provided by a capacitance coupling between the first capacitor electrode PC1 and the second electrode P2. The second electrode P2 is connected to the ground terminal GND. The first inductor L1 is connected between the first capacitor electrode PC1 and the first electrode P1. The first inductor L1 corresponds to the first inductor via V1.

(3.2) Second Capacitor and Second Inductor

The second capacitor C2 is defined between the second capacitor electrode PC2 and the second electrode P2. The second capacitor C2 is provided by a capacitance coupling between the second capacitor electrode PC2 and the second electrode P2. The second inductor L2 is connected between the second capacitor electrode PC2 and the first electrode P1. The second inductor L2 corresponds to the second inductor via V2 (via conductors V21 and V22, see FIG. 1).

(3.3) Third Capacitor and Third Inductor

The third capacitor C3 is defined between the third capacitor electrode PC3 and the second electrode P2. The third capacitor C3 is provided by a capacitance coupling between the third capacitor electrode PC3 and the second electrode P2. The third capacitor C3 is connected to the output terminal T2. The third inductor L3 is connected between the third capacitor electrode PC3 and the first electrode P1. The third inductor L3 corresponds to the third inductor via V3 (via conductors V31 and V32, see FIG. 1).

(3.4) Fourth Capacitor

The fourth capacitor C4 is defined between the first capacitor electrode PC1 and the second capacitor electrode PC2. The fourth capacitor C4 is provided by a capacitance coupling between the first capacitor electrode PC1 and the second capacitor electrode PC2.

(3.5) Fifth Capacitor

The fifth capacitor C5 is defined between the second capacitor electrode PC2 and the third capacitor electrode PC3. The fifth capacitor C5 is provided by a capacitance coupling between the second capacitor electrode PC2 and the third capacitor electrode PC3.

(3.6) Fourth Inductor

The fourth inductor L4 is connected between the input terminal T1 and the first capacitor electrode PC1. The fourth inductor L4 corresponds to the first inductor pattern portion PL1.

The LC filter 1 does not include a capacitor between the first capacitor electrode PC1 and the third capacitor electrode PC3. That is, the LC filter 1 does not include a capacitor provided by a capacitance coupling between the first capacitor electrode PC1 and the third capacitor electrode PC3.

(4) Filter Characteristics

Figures 5, 6:
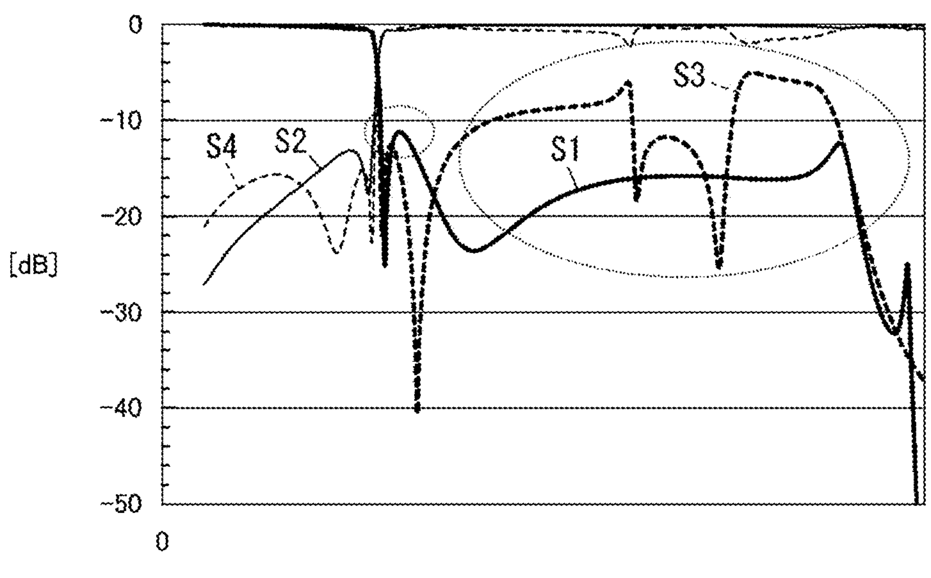
FIG. 5 is a characteristic diagram of the LC filter of FIG. 1.
FIG. 6 is a transparent perspective view of an LC filter according to Example Embodiment 2 of the present invention.

Next, a simulation result of the bandpass characteristics of the LC filter 1 according to Example Embodiment 1 will be described with reference to FIG. 5. FIG. 5 illustrates the bandpass characteristics (solid line S1 and solid line S2) of the LC filter 1 according to Example Embodiment 1 and the bandpass characteristics (broken line S3 and broken line S4) of an LC filter according to a comparative example. In FIG. 5, a horizontal axis indicates a frequency, and a vertical axis indicates an insertion loss (solid line S1 and broken line S3) and a return loss (solid line S2 and broken line S4) of the LC filter 1.

First, the LC filter according to the comparative example will be described. In the LC filter according to the comparative example, the fourth inductor L4 is not connected between the input terminal T1 and the first capacitor electrode PC1. In the LC filter according to the comparative example, the first capacitor electrode PC1 and the third capacitor electrode PC3 face each other. Specifically, in the LC filter according to the comparative example, a capacitor defined by the first capacitor electrode PC1 and the third capacitor electrode PC3 is provided. For the insertion loss (broken line S3), approximately 10 dB is achieved at an end portion on the high frequency side of the pass band. On the other hand, in the non-pass band that is a frequency band higher than a cutoff frequency, there is a band with the attenuation of less than about 10 dB, and sufficient attenuation cannot be secured. In the reflection characteristic (broken line S4), the reflection characteristic is lower than about 12 dB over the entire region of the pass band.

Subsequently, the LC filter 1 according to Example Embodiment 1 will be described. As described above, in the LC filter 1 according to Example Embodiment 1, the fourth inductor L4 is connected between the input terminal T1 and the first capacitor electrode PC1 (see FIG. 4). In the LC filter 1 according to Example Embodiment 1, the first capacitor electrode PC1 and the third capacitor electrode PC3 do not face each other (see FIGS. 1 to 3). Specifically, in the LC filter 1 according to Example Embodiment 1, the capacitor defined by the first capacitor electrode PC1 and the third capacitor electrode PC3 is not provided. As a result, for the insertion loss (solid line S1), about 10 dB is achieved at the end portion on the high frequency side of the pass band. In addition, in the non-pass band on the high frequency side with respect to the pass band, the attenuation characteristics of about 10 dB or more are obtained. In addition, the reflection characteristic (solid line S2) is lower than about 12 dB over the entire region of the pass band, as in the reflection characteristic (broken line S4) according to the comparative example.

As described above, by providing the configuration in which the fourth inductor L4 is connected between the input terminal T1 and the first capacitor electrode PC1, and the capacitor is not provided between the first capacitor electrode PC1 and the third capacitor electrode PC3 to the LC filter (low pass filter) 1, it is possible to improve the attenuation characteristics in the non-pass band while maintaining the loss with respect to the signal in the pass band to the same extent.

(5) Advantageous Effects

In the LC filter 1 according to Example Embodiment 1, the fourth inductor L4 connected to at least one of the first electrode P1, the first inductor via V1, and the first capacitor electrode PC1, and the input terminal T1 (first input/output port) is provided. The first capacitor electrode PC1 and the third capacitor electrode PC3 do not face each other. As a result, the fourth inductor L4 including the first inductor pattern portion PL1 can improve (maintain) the loss with respect to the signal in the pass band and can improve the attenuation characteristics in the non-pass band including the high frequency band.

In the LC filter 1 according to Example Embodiment 1, the inductance of the first inductor pattern portion PL1 defining the fourth inductor L4 is larger than the inductance of each of the first inductor via V1 defining the first inductor L1, the second inductor via V2 defining the second inductor L2, and the third inductor via V3 defining the third inductor L3. As a result, the high frequency components can be reduced by the fourth inductor L4, and thus the attenuation in the high frequency band can be further increased.

In the LC filter 1 according to Example Embodiment 1, the first inductor pattern portion PL1 defining the fourth inductor L4 is provided in a wound state on the plane in at least one of the plurality of dielectric layers. As a result, the inductance of the fourth inductor L4 can be easily increased as compared with the inductors (first inductor L1, second inductor L2, and third inductor L3) formed of the inductor via.

In the LC filter 1 according to Example Embodiment 1, the first inductor pattern portion PL1 defining the fourth inductor L4 is provided in a laminated and wound state in at least two of the plurality of dielectric layers. As a result, the inductance of the fourth inductor L4 can be further increased without increasing the area of the first inductor pattern portion PL1 on the plane. The area of the first inductor pattern portion PL1 on the plane refers to the area of the region surrounded by the outer periphery of the first inductor pattern portion PL1 in plan view in the lamination direction (first direction D1) of the multilayer body 2. The outer periphery of the first inductor pattern portion PL1 refers to the line connecting the outermost edges of the first inductor pattern portion PL1 in plan view in the lamination direction of the multilayer body 2.

(6) Modified Example

Hereinafter, modified examples of Example Embodiment 1 will be described.

(6.1) Modified Example 1

As Modified example 1 of Example Embodiment 1, the first inductor via V1 may include a plurality of via conductors. In other words, the first inductor via V1 need only include at least one via conductor.

(6.2) Modified Example 2

As Modified example 2 of Example Embodiment 1, the second inductor via V2 may include one via conductor, as in the first inductor via V1. Alternatively, the second inductor via V2 may include three or more via conductors. In other words, the second inductor via V2 need only include at least one via conductor.

(6.3) Modified Example 3

As Modified example 3 of Example Embodiment 1, the third inductor via V3 may include one via conductor, as in the first inductor via V1. Alternatively, the third inductor via V3 may include three or more via conductors. In other words, the third inductor via V3 need only include at least one via conductor.

(6.4) Modified Example 4

As Modified example 4 of Example Embodiment 1, the first inductor pattern portion PL1 may be provided in a wound state on a plane in one of the plurality of dielectric layers (not illustrated) of the multilayer body 2. In addition, the first inductor pattern portion PL1 may be provided in a laminated and wound state in three or more of the plurality of dielectric layers of the multilayer body 2. In other words, the first inductor pattern portion PL1 need only be provided in a wound state on a plane in at least one of the plurality of dielectric layers of the multilayer body 2.

The LC filter 1 according to each of the above-described modified examples also has the same or substantially the same advantageous effects as the advantageous effects of the LC filter 1 according to Example Embodiment 1.

Example Embodiment 2

Figure 7:
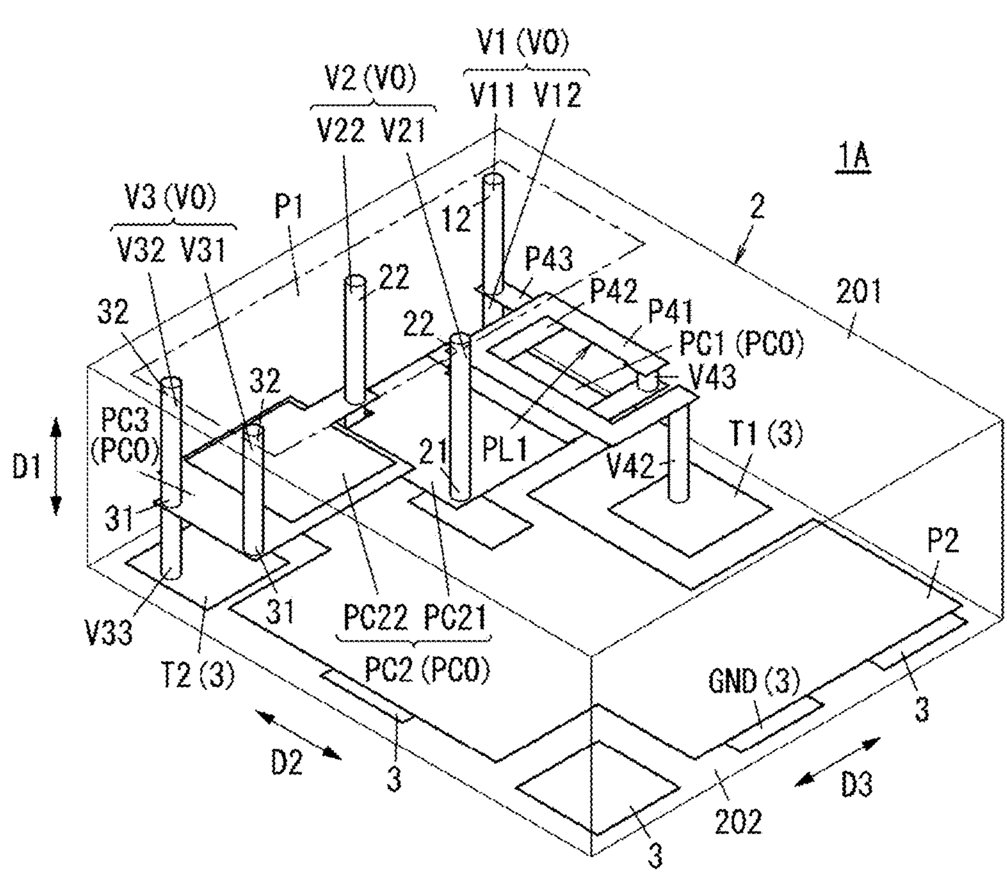
FIG. 7 is a transparent perspective view of the LC filter of FIG. 6.
Figure 8:
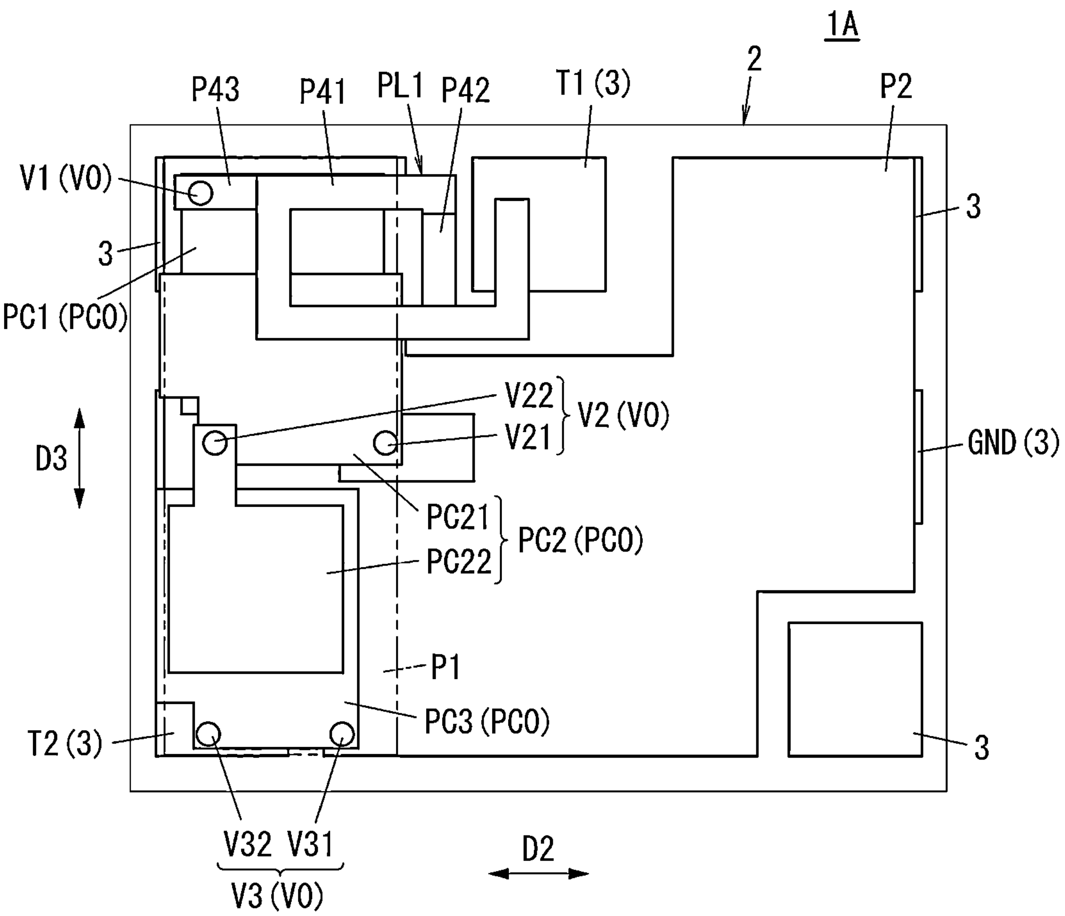
FIG. 8 is a transparent plan view of the LC filter of FIG. 6.

An LC filter 1A according to Example Embodiment 2 of the present invention is different from the LC filter 1 (see FIG. 1) according to Example Embodiment 1 in that the first inductor via V1 includes a plurality of (in the illustrated example, two) via conductors V11 and V12, as illustrated in FIGS. 6 to 8. Regarding the LC filter 1A according to Example Embodiment 2, the same or corresponding components as the components of the LC filter 1 according to Example Embodiment 1 are designated by the same reference numerals, and the description thereof will be omitted.

(1) Configuration

The first inductor via V1 according to Example Embodiment 2 includes the via conductor V11 (first portion via) and the via conductor V12 (second portion via), as illustrated in FIGS. 6 to 8. The via conductor V11 is connected to the first electrode P1 and the first inductor pattern portion PL1. The via conductor V12 is connected to the first capacitor electrode PC1 and the first inductor pattern portion PL1. Regarding the first inductor via V1 according to Example Embodiment 2, the description of the same or similar configuration and function as the configuration and function of the first inductor via V1 (see FIG. 1) according to Example Embodiment 1 will be omitted.

As illustrated in FIGS. 6 to 8, the first inductor pattern portion PL1 according to Example Embodiment 2 includes a first end connected to at least one of the first electrode P1, the first inductor via V1, and the first capacitor electrode PC1, and includes a second end connected to the input terminal T1. The first inductor pattern portion PL1 defines a fourth inductor L4 (see FIG. 9).

More specifically, the first inductor pattern portion PL1 includes the plurality of (in the illustrated example, two) pattern portions P41 and P42, a connection portion P43, and the plurality of (in the illustrated example, two) via conductors V42 and V43. The pattern portion P42 is connected to the first inductor via V1 with the connection portion P43 interposed therebetween. The pattern portion P41 is connected to the input terminal T1 with the via conductor V42 interposed therebetween. In addition, the pattern portion P41 and the pattern portion P42 are connected by the via conductor V43, and are arranged along the first direction D1. The connection portion P43 corresponds to the first end of the first inductor pattern portion PL1, and the via conductor V42 corresponds to the second end of the first inductor pattern portion PL1. Regarding the first inductor pattern portion PL1 according to Example Embodiment 2, the description of the same or similar configuration and function as the configuration and function of the first inductor pattern portion PL1 (see FIG. 1) according to Example Embodiment 1 will be omitted.

Figure 9:
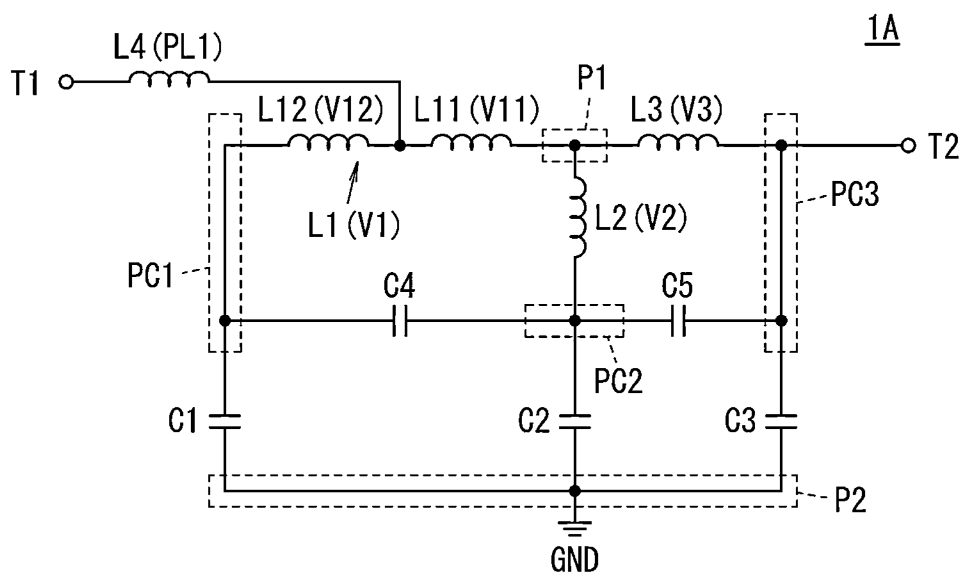
FIG. 9 is a circuit diagram of the LC filter of FIG. 6.

The first inductor L1 according to Example Embodiment 2 includes two inductors L11 and L12, as illustrated in FIG. 9. The inductor L11 is defined by the via conductor V11. The inductor L12 is defined by the via conductor V12. The inductor L11 is connected to the second inductor L2 and the third inductor L3, and the fourth inductor L4. The inductor L12 is connected to the first capacitor C1 and the fourth capacitor C4, and the fourth inductor L4. Regarding the first inductor L1 according to Example Embodiment 2, the description of the same or similar configuration and function as the configuration and function of the first inductor L1 (see FIG. 4) according to Example Embodiment 1 will be omitted.

As in the LC filter 1 (see FIG. 4) according to Example Embodiment 1, the LC filter 1A according to Example Embodiment 2 does not include a capacitor between the first capacitor electrode PC1 and the third capacitor electrode PC3. That is, the LC filter 1A does not include a capacitor provided by a capacitance coupling between the first capacitor electrode PC1 and the third capacitor electrode PC3.

(2) Advantageous Effects

Also in the LC filter 1A according to Example Embodiment 2, as in the LC filter 1 according to Example Embodiment 1, the fourth inductor L4 defined by the first inductor pattern portion PL1 can improve the loss with respect to the signal in the pass band and can improve the attenuation characteristics in the non-pass band including the high frequency band.

(3) Modified Example

As a modified example of Example Embodiment 2, the first inductor via V1 is not limited to including two via conductors, and may include three or more via conductors.

The LC filter 1A according to the above-described modified example also has the same or substantially the same advantageous effects as the advantageous effects of the LC filter 1A according to Example Embodiment 2.

Example Embodiment 3

Figure 10:
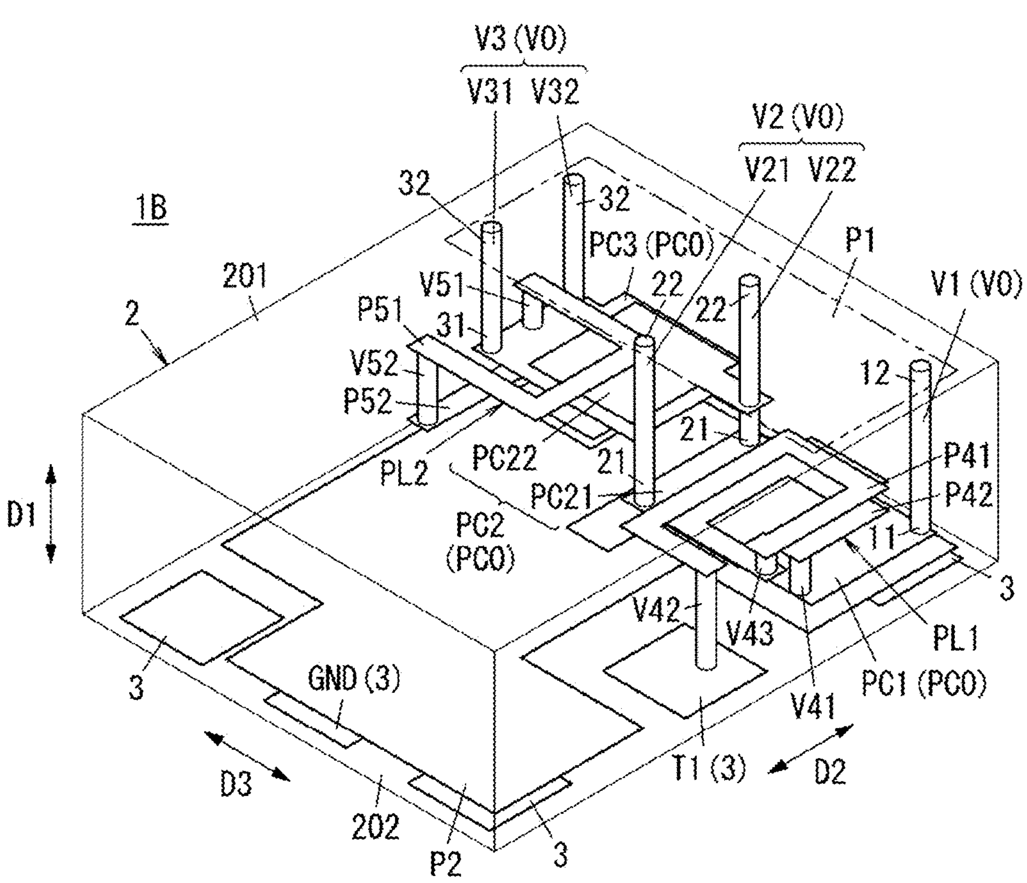
FIG. 10 is a transparent perspective view of an LC filter according to Example Embodiment 3 of the present invention.
Figure 11:
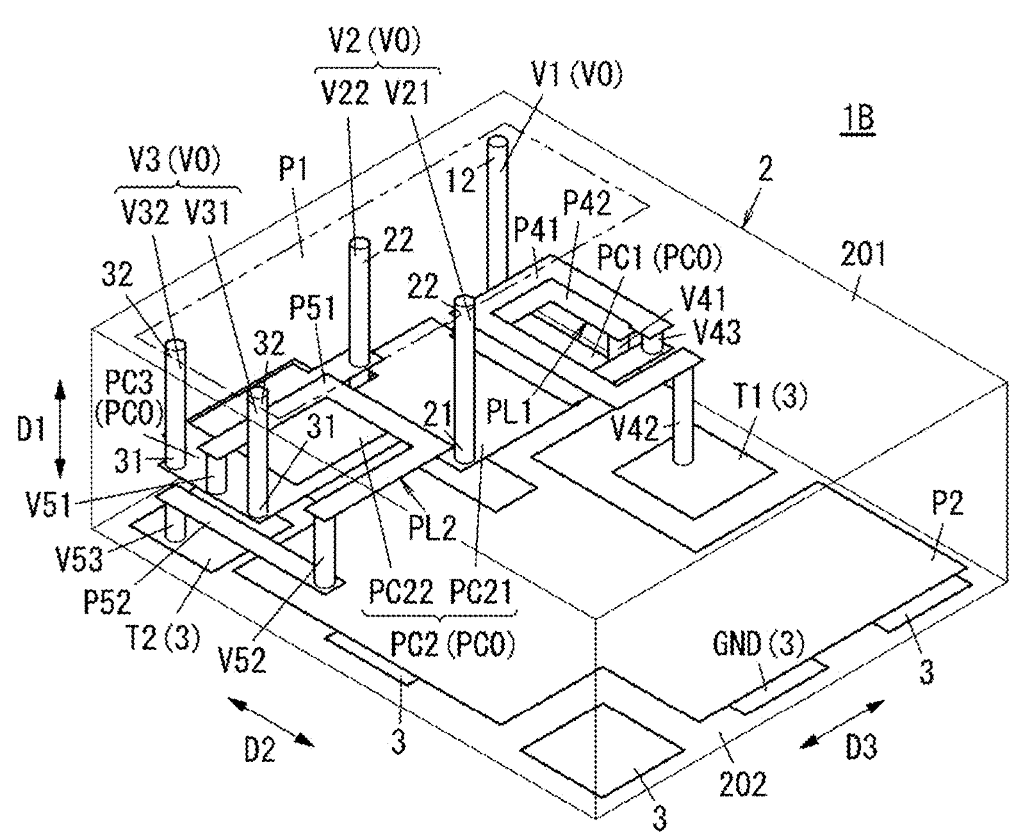
FIG. 11 is a transparent perspective view of the LC filter of FIG. 10.
Figure 12:
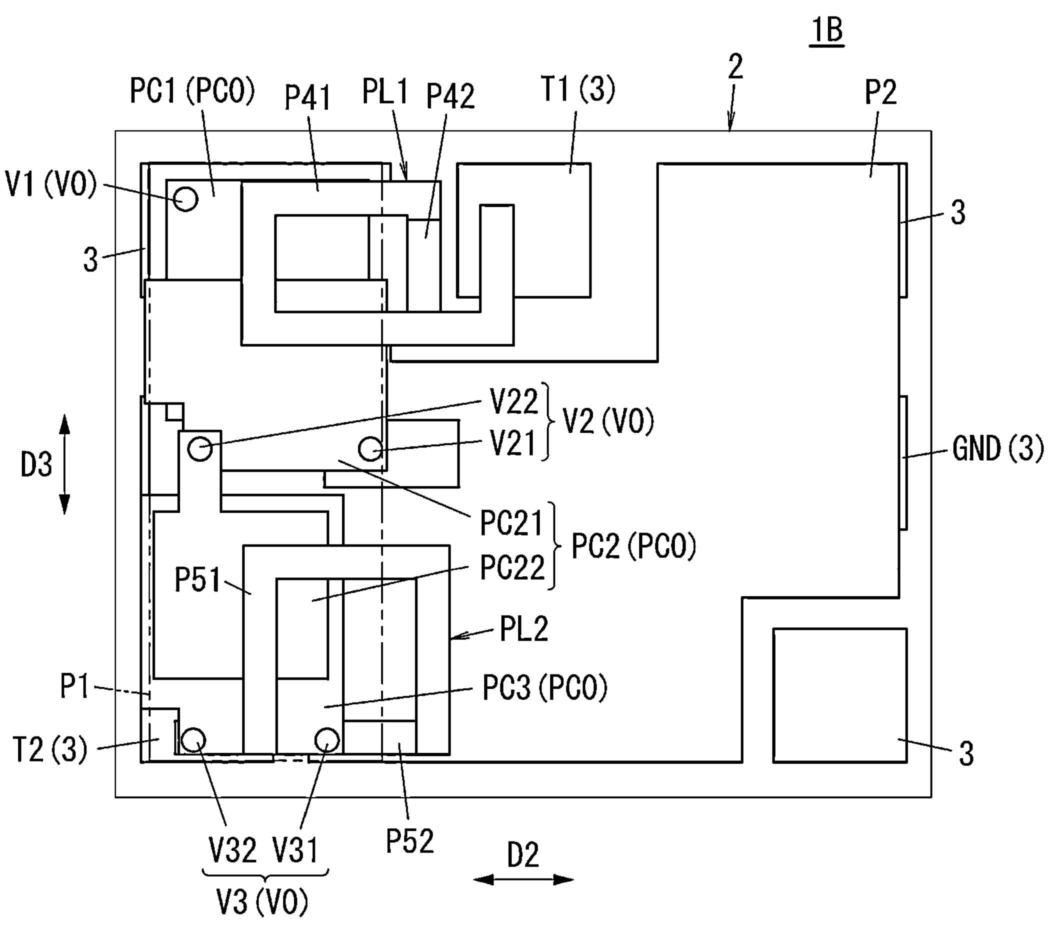
FIG. 12 is a transparent plan view of the LC filter of FIG. 10.

An LC filter 1B according to Example Embodiment 3 of the present invention is different from the LC filter 1 (see FIG. 1) according to Example Embodiment 1 in that the LC filter 1B includes a second inductor pattern portion PL2 as illustrated in FIGS. 10 to 12. Regarding the LC filter 1B according to Example Embodiment 3, the same or similar components as the components of the LC filter 1 according to Example Embodiment 1 are designated by the same reference numerals, and the description thereof will be omitted.

(1) Configuration

The LC filter 1B according to Example Embodiment 3 includes the second inductor pattern portion PL2 as illustrated in FIGS. 10 to 12.

The second inductor pattern portion PL2 includes a third end connected to at least one of the first electrode P1, the third inductor via V3, and the third capacitor electrode PC3, and includes a fourth end connected to the output terminal T2. The second inductor pattern portion PL2 defines a fifth inductor L5 (see FIG. 13).

More specifically, the second inductor pattern portion PL2 includes a plurality of (in the illustrated example, two) pattern portions P51 and P52, and a plurality of (in the illustrated example, three) via conductors V51 to V53. The pattern portion P51 is connected to the third capacitor electrode PC3 with the via conductor V51 interposed therebetween. The pattern portion P51 is connected to the output terminal T2 with the via conductor V52, the pattern portion P52, and the via conductor V53 interposed therebetween. The via conductor V51 corresponds to the third end of the second inductor pattern portion PL2, and the via conductor V53 corresponds to the second end of the second inductor pattern portion PL2.

Figure 13:
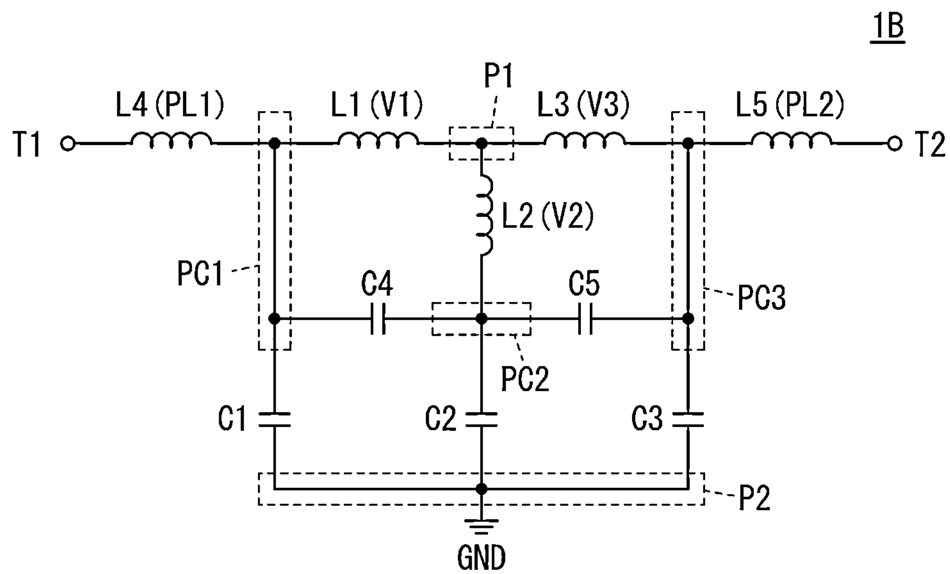
FIG. 13 is a circuit diagram of the LC filter of FIG. 10.

Next, a circuit configuration of the LC filter 1B according to Example Embodiment 3 will be described with reference to FIG. 13. In FIG. 13, connection portions illustrated by broken lines correspond to the first electrode P1, the second electrode P2, the first capacitor electrode PC1, the second capacitor electrode PC2, and the third capacitor electrode PC3 in FIGS. 10 to 12.

As illustrated in FIG. 13, the LC filter 1B includes the first capacitor C1, the second capacitor C2, the third capacitor C3, the fourth capacitor C4, the fifth capacitor C5, the first inductor L1, the second inductor L2, the third inductor L3, the fourth inductor L4, and the fifth inductor L5.

The fifth inductor L5 is connected between the output terminal T2 and the third capacitor electrode PC3. The fifth inductor L5 corresponds to the second inductor pattern portion PL2.

Meanwhile, the inductance of the second inductor pattern portion PL2 is larger than the inductance of each of the first inductor via V1, the second inductor via V2, and the third inductor via V3. As a result, since the high frequency components can be reduced by the fifth inductor L5 (see FIG. 13) formed of the second inductor pattern portion PL2, the attenuation in the high frequency band can be further increased.

The second inductor pattern portion PL2 is provided in a wound state on a plane in at least one of the plurality of dielectric layers (not illustrated) of the multilayer body 2. As a result, the inductance of the fifth inductor L5 can be easily increased as compared with the inductors (first inductor L1, second inductor L2, and third inductor L3) defined by the inductor via.

The LC filter 1B according to Example Embodiment 3 does not include a capacitor between the first capacitor electrode PC1 and the third capacitor electrode PC3. That is, the LC filter 1B does not include a capacitor provided by a capacitance coupling between the first capacitor electrode PC1 and the third capacitor electrode PC3.

(2) Filter Characteristics

Figures 14, 15:
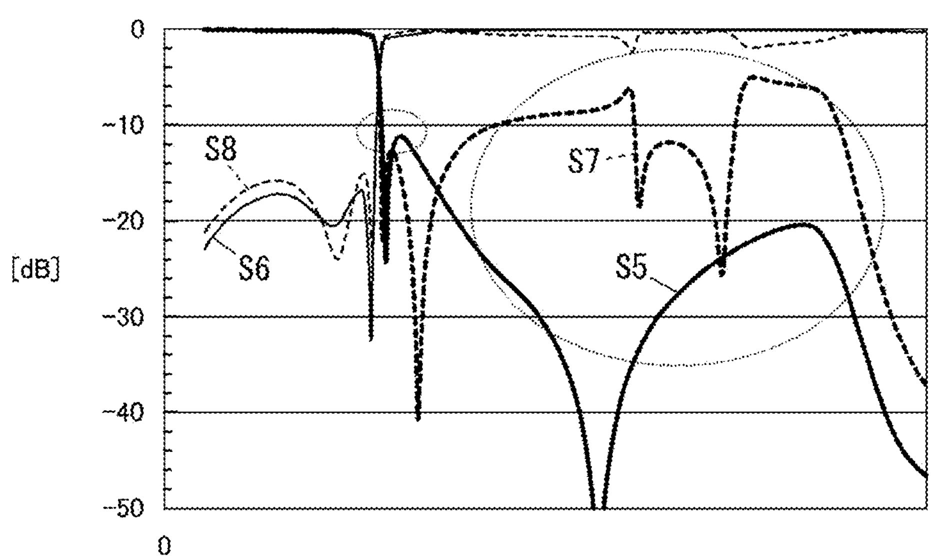
FIG. 14 is a characteristic diagram of the LC filter of FIG. 10.
FIG. 15 is a transparent perspective view of an LC filter according to Example Embodiment 4 of the present invention.

Next, a simulation result of the bandpass characteristics of the LC filter 1B according to Example Embodiment 3 will be described with reference to FIG. 14. FIG. 14 illustrates the bandpass characteristics (solid line S5 and solid line S6) of the LC filter 1B according to Example Embodiment 3 and the bandpass characteristics (broken line S7 and broken line S8) of an LC filter according to a comparative example. In FIG. 14, a horizontal axis indicates a frequency, and a vertical axis indicates an insertion loss (solid line S5 and broken line S7) and a return loss (solid line S6 and broken line S8) of the LC filter 1B.

First, the LC filter according to the comparative example will be described. In the LC filter according to the comparative example, the fourth inductor L4 is not connected between the input terminal T1 and the first capacitor electrode PC1, and the fifth inductor L5 is not connected between the output terminal T2 and the third capacitor electrode PC3. In the LC filter according to the comparative example, the first capacitor electrode PC1 and the third capacitor electrode PC3 face each other. Specifically, in the LC filter according to the comparative example, a capacitor defined by the first capacitor electrode PC1 and the third capacitor electrode PC3 is provided. For the insertion loss (broken line S7), about 10 dB is achieved at the end portion on the high frequency side of the pass band. On the other hand, in the non-pass band that is a frequency band higher than a cutoff frequency, there is a band with the attenuation of less than about 10 dB, and sufficient attenuation cannot be secured. In the reflection characteristic (broken line S8), the reflection characteristic is lower than about 12 dB over the entire region of the pass band.

Subsequently, the LC filter 1B according to Example Embodiment 3 will be described. As described above, in the LC filter 1B according to Example Embodiment 3, the fourth inductor L4 is connected between the input terminal T1 and the first capacitor electrode PC1 (see FIG. 13), and the fifth inductor L5 is connected between the output terminal T2 and the third capacitor electrode PC3 (see FIG. 13). In the LC filter 1B according to Example Embodiment 3, the first capacitor electrode PC1 and the third capacitor electrode PC3 do not face each other (see FIGS. 10 to 12). Specifically, in the LC filter 1B according to Example Embodiment 3, the capacitor defined by the first capacitor electrode PC1 and the third capacitor electrode PC3 is not provided. As a result, for the insertion loss (solid line S5), about 10 dB is achieved at the end portion on the high frequency side of the pass band. In addition, in the non-pass band on the high frequency side with respect to the pass band, the attenuation characteristics of about 20 dB or more are obtained. In addition, the reflection characteristic (solid line S6) is lower than about 16 dB over the entire region of the pass band.

As described above, by applying the configuration in which the fourth inductor L4 is connected between the input terminal T1 and the first capacitor electrode PC1, the fifth inductor L5 is connected between the output terminal T2 and the third capacitor electrode PC3, and the capacitor is not provided between the first capacitor electrode PC1 and the third capacitor electrode PC3 to the LC filter (low pass filter) 1B, it is possible to improve the attenuation characteristics in the non-pass band while maintaining the loss with respect to the signal in the pass band to the same or substantially the same extent.

(3) Advantageous Effects

In the LC filter 1B according to Example Embodiment 3, the fifth inductor L5 connected to at least one of the first electrode P1, the third inductor via V3, and the third capacitor electrode PC3, and the output terminal T2 (second input/output port) is provided. As a result, the high frequency components can be reduced by the fifth inductor L5, and thus the attenuation in the high frequency band can be further increased.

In the LC filter 1B according to Example Embodiment 3, the inductance of the second inductor pattern portion PL2 defining the fifth inductor L5 is larger than the inductance of each of the first inductor via V1 defining the first inductor L1, the second inductor via V2 defining the second inductor L2, and the third inductor via V3 defining the third inductor L3. As a result, the high frequency components can be reduced by the fifth inductor L5, and thus the attenuation in the high frequency band can be further increased.

In the LC filter 1B according to Example Embodiment 3, the second inductor pattern portion PL2 defining the fifth inductor L5 is provided in a wound state on the plane in at least one of the plurality of dielectric layers. As a result, the inductance of the fifth inductor L5 can be easily increased as compared with the inductors (first inductor L1, second inductor L2, and third inductor L3) defined by the inductor via.

(4) Modified Example

As a modified example of Example Embodiment 3, the second inductor pattern portion PL2 may be provided in a laminated and wound state in at least two of the plurality of dielectric layers (not illustrated) of the multilayer body 2. In other words, the second inductor pattern portion PL2 need only be provided in a wound state on a plane in at least one of the plurality of dielectric layers of the multilayer body 2.

In the LC filter 1B according to the modified example of Example Embodiment 3, the second inductor pattern portion PL2 defining the fifth inductor L5 is provided in a laminated and wound state in at least two of the plurality of dielectric layers. As a result, the inductance of the fifth inductor L5 can be further increased without increasing an area of the second inductor pattern portion PL2 on the plane.

The LC filter 1B according to the above-described modified example also has the same or substantially the same advantageous effects as the advantageous effects of the LC filter 1B according to Example Embodiment 3.

Example Embodiment 4

Figure 16:
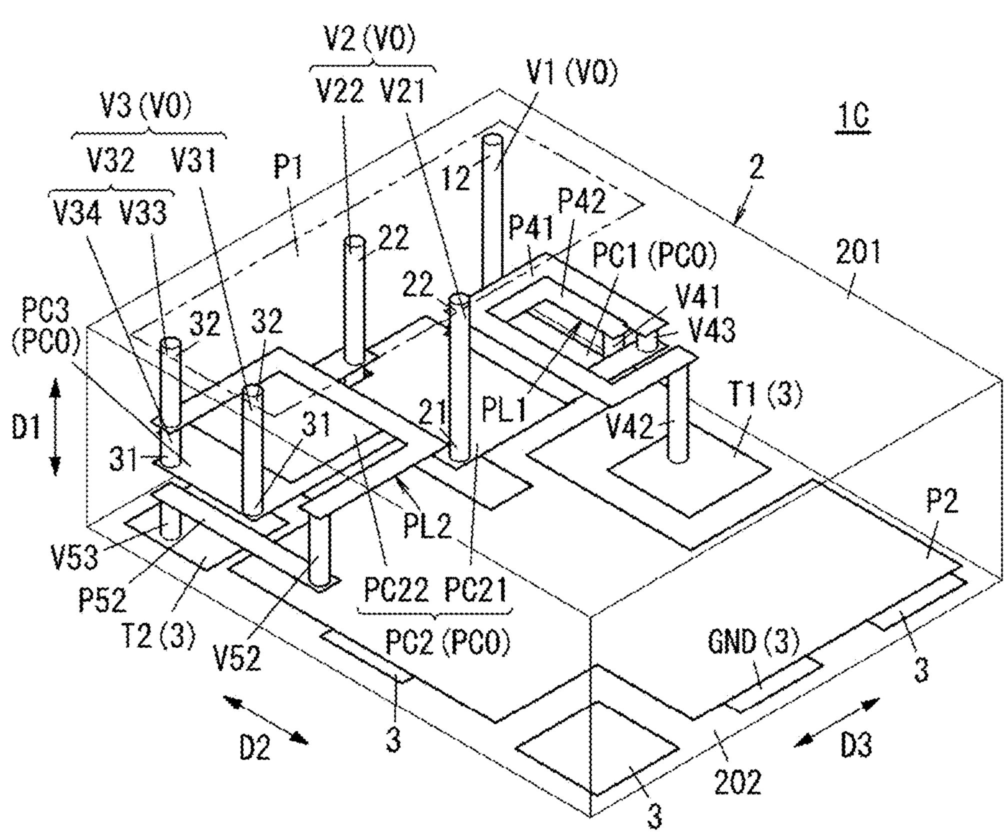
FIG. 16 is a transparent perspective view of the LC filter of FIG. 15.
Figure 17:
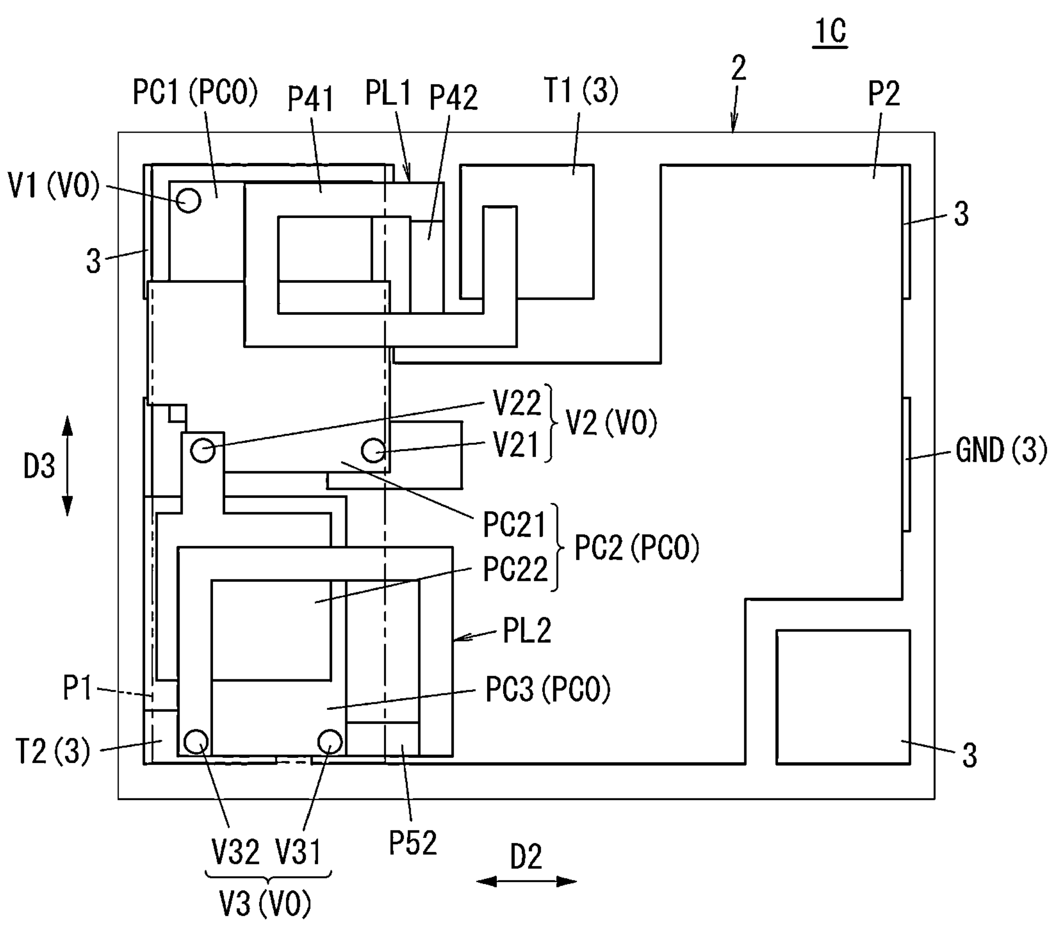
FIG. 17 is a transparent plan view of the LC filter of FIG. 15.

An LC filter 1C according to Example Embodiment 4 of the present invention is different from the LC filter 1B (see FIG. 10) according to Example Embodiment 3 in that the third inductor via V3 includes a plurality of (in the illustrated example, two) via conductors V33 and V34 as illustrated in FIGS. 15 to 17. Regarding the LC filter 1C according to Example Embodiment 4, the same or similar components as the components of the LC filter 1B according to Example Embodiment 3 are designated by the same reference numerals, and the description thereof will be omitted.

(1) Configuration

As illustrated in FIGS. 15 to 17, the third inductor via V3 according to Example Embodiment 4 includes the via conductor V33 (first portion via) and the via conductor V34 (second portion via). More specifically, the via conductor V32 in the third inductor via V3 includes the via conductor V33 and the via conductor V34. The via conductor V33 is connected to the first electrode P1 and the second inductor pattern portion PL2. The via conductor V34 is connected to the third capacitor electrode PC3 and the second inductor pattern portion PL2. Regarding the third inductor via V3 according to Example Embodiment 4, the description of the same or similar configuration and function as the configuration and function of the third inductor via V3 (see FIG. 10) according to Example Embodiment 3 will be omitted.

Figure 18:
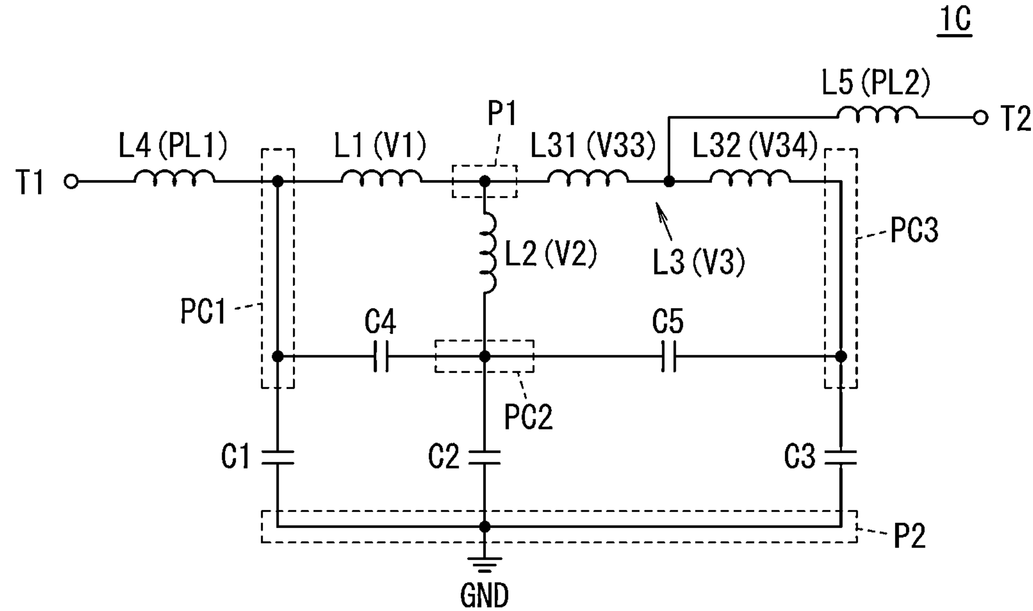
FIG. 18 is a circuit diagram of the LC filter of FIG. 15.

As illustrated in FIG. 18, the third inductor L3 according to Example Embodiment 4 includes two inductors L31 and L32. The inductor L31 is defined by the via conductor V33. The inductor L32 is defined by the via conductor V34. The inductor L31 is connected to the first inductor L1 and the second inductor L2, and the fifth inductor L5. The inductor L32 is connected to the third capacitor C3 and the fifth capacitor C5, and the fifth inductor L5. Regarding the first inductor L1 according to Example Embodiment 2, the description of the same or similar configuration and function as the configuration and function of the first inductor L1 (see FIG. 4) according to Example Embodiment 1 will be omitted.

As in the LC filter 1B (see FIG. 13) according to Example Embodiment 3, the LC filter 1C according to Example Embodiment 4 does not include a capacitor provided between the first capacitor electrode PC1 and the third capacitor electrode PC3. That is, the LC filter 1C does not include a capacitor provided by a capacitance coupling between the first capacitor electrode PC1 and the third capacitor electrode PC3.

(2) Advantageous Effects

Also in the LC filter 1C according to Example Embodiment 4, as in the LC filter 1B according to Example Embodiment 3, the high frequency components can be reduced by the fifth inductor L5, and thus the attenuation in the high frequency band can be further increased.

(3) Modified Example

In a modified example of Example Embodiment 4, the third inductor via V3 (via conductor V32) is not limited including two via conductors V33 and V34 (portion vias), and may include three or more via conductors (portion vias).

The LC filter 1C according to the above-described modified example also has the same or substantially the same advantageous effects as the advantageous effects of the LC filter 1C according to Example Embodiment 4.

Example Embodiment 5

In Example Embodiment 5 of the present invention, a configuration in which the LC filters 1 and 1A to 1C according to Example Embodiments 1 to 4 and each modified example are applied to a multiplexer 7 (see FIG. 19) will be described. Hereinafter, a case where the LC filter 1 according to Example Embodiment 1 is applied to the multiplexer 7 will be described.

(1) Configuration

Figure 19:
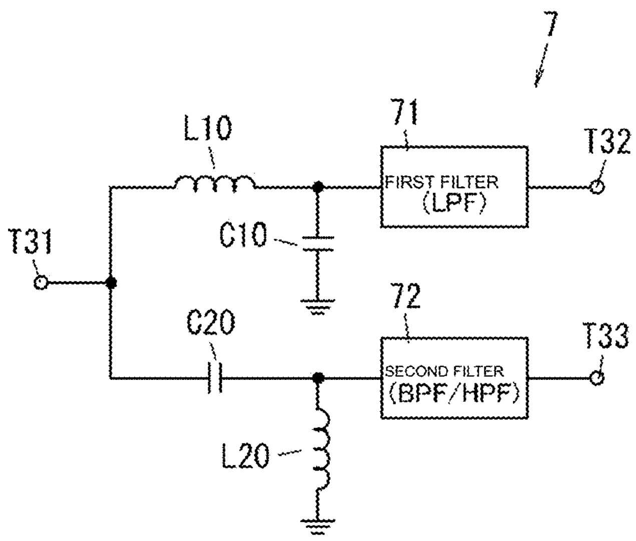
FIG. 19 is a schematic diagram of a multiplexer according to Example Embodiment 5 of the present invention.

As illustrated in FIG. 19, the multiplexer 7 according to Example Embodiment 5 includes an input terminal T31, two output terminals T32 and T33, a first filter 71, a second filter 72, a plurality of (in the illustrated example, two) inductors L10 and L20, and a plurality of (in the illustrated example, two) capacitors C10 and C20.

The first filter 71 is connected between the input terminal T31 and the output terminal T32. The first filter 71 is a low pass filter (LPF) that allows a signal in a frequency band lower than a predetermined frequency to pass therethrough, and includes the LC filter 1.

The inductor L10 includes one end (first end) connected to the input terminal T31, and another end (second end) connected to the first filter 71. The capacitor C10 is connected between a connection node between the inductor L10 and the first filter 71, and a ground. The inductor L10 and the capacitor C10 define the low pass filter, and define and function as a branch circuit for the high frequency signal input to the input terminal T31.

The second filter 72 is connected between the input terminal T31 and the output terminal T33. The second filter 72 is, for example, a band pass filter (BPF) or a high pass filter (HPF) that allows a signal in a frequency band higher than a pass band of the first filter 71 to pass therethrough.

The capacitor C20 includes one end (first end) connected to the input terminal T31, and another end (second end) connected to the second filter 72. The inductor L20 is connected between a connection node between the capacitor C20 and the second filter 72, and a ground. The inductor L20 and the capacitor C20 define the high pass filter, and define and function as a branch circuit for the high frequency signal received by the input terminal T31.

(2) Advantageous Effects

By applying the LC filter 1 according to Example Embodiment 1 as the first filter 71 (low pass filter) in the multiplexer 7 according to Example Embodiment 5, it is possible to provide the multiplexer 7 having a low loss and high attenuation characteristics. Even in a case where any one of the LC filters 1A to 1C according to Example Embodiment 2 to 4 is applied as the first filter 71, the same or substantially the same advantageous effects are obtained.

(3) Modified Example

As a modified example of Example Embodiment 5, any one of the LC filters 1 and 1A to 1C according to Example Embodiments 1 to 4 and each modified example may be applied to a multiplexer 7A including three or more filters.

Figure 20:
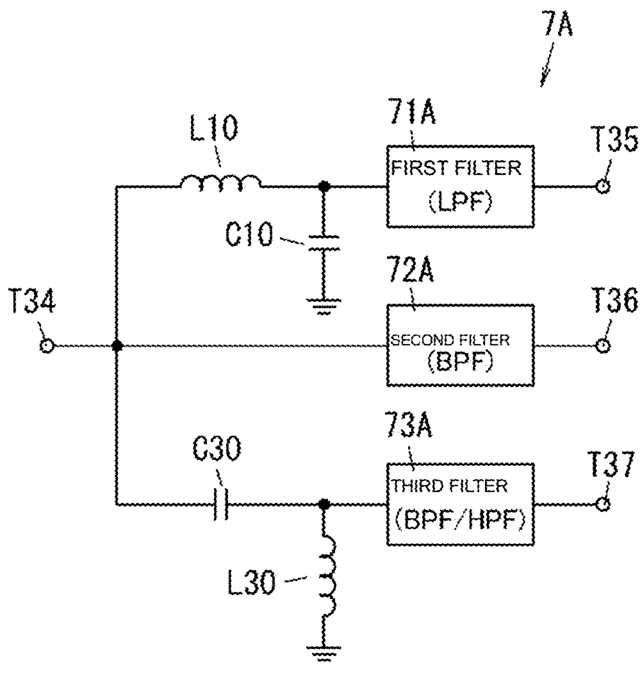
FIG. 20 is a schematic diagram of a multiplexer according to a modified example of Example Embodiment 5 of the present invention.

As illustrated in FIG. 20, the multiplexer 7A includes an input terminal T34, three output terminals T35 to T37, a first filter 71A, a second filter 72A, a third filter 73A, a plurality of (in the illustrated example, two) inductors L10 and L30, and a plurality of (in the illustrated example, two) capacitors C10 and C30.

The first filter 71A is connected between the input terminal T34 and the output terminal T35. The first filter 71A is a low pass filter (LPF) that allows a signal in a frequency band lower than a predetermined frequency to pass therethrough, and the same or similar configuration as the configuration of any one of the LC filters 1 and 1A to 1C according to Example Embodiments 1 to 4 and each modified example can be provided.

The inductor L10 includes one end (first end) connected to the input terminal T34, and another end (second end) connected to the first filter 71A. The capacitor C10 is connected between a connection node between the inductor L10 and the first filter 71A, and a ground. The inductor L10 and the capacitor C10 define the low pass filter, and define and function as a branch circuit for the high frequency signal input to the input terminal T34.

The second filter 72A is connected between the input terminal T34 and the output terminal T36. The second filter 72A is a band pass filter (BPF) that allows a signal in a frequency band higher than a pass band of the first filter 71A to pass therethrough.

The third filter 73A is connected between the input terminal T34 and the output terminal T37. The third filter 73A is, for example, a high pass filter (HPF) or a band pass filter (BPF) that allows a signal in a frequency band higher than a pass band of the second filter 72A to pass therethrough.

The capacitor C30 includes one end (first end) connected to the input terminal T34, and another end (second end) connected to the third filter 73A. The inductor L30 is connected between a connection node between the capacitor C30 and the third filter 73A, and a ground. The inductor L30 and the capacitor C30 define the high pass filter, and define and function as a branch circuit for the high frequency signal input to the input terminal T34.

Also in the multiplexer 7A according to the modified example, by applying any one of the LC filters 1 and 1A to 1C according to Example Embodiments 1 to 4 and each modified example as the low pass filter provided in a pass path of a signal in the lowest frequency band, the multiplexer 7A having a low loss and high attenuation characteristics can be provided. That is, also in the multiplexer 7A, it is possible to improve the attenuation characteristics in the non-pass band while maintaining the loss with respect to the signal in the pass band to the same or substantially the same extent.

The multiplexer 7A according to the above-described modified example also has the same or substantially the same advantageous effects as the advantageous effects of the multiplexer 7 according to Example Embodiment 5.

Example Embodiment 6

In Example Embodiment 6 of the present invention, a high frequency module 8 including any one of the LC filters 1, 1A, 1B, and 1C according to Example Embodiments 1 to 4 and each modified example, and a communication device 9 including the high frequency module 8 will be described with reference to the drawings. Hereinafter, a case where the LC filter 1 according to Example Embodiment 1 is used will be described.

(1) High Frequency Module

Figure 21:
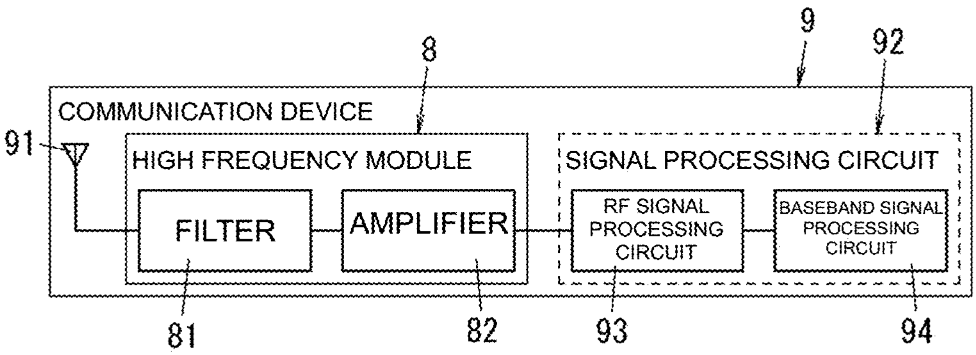
FIG. 21 is a schematic diagram of a high frequency module and a communication device according to Example Embodiment 6 of the present invention.

As illustrated in FIG. 21, the high frequency module 8 according to Example Embodiment 6 includes a filter 81 and an amplifier 82. The filter 81 includes the LC filter 1 (see FIG. 1).

The high frequency module 8 is, for example, a module that is compatible with a fourth generation mobile communication (4G) standard and a fifth generation mobile communication (5G) standard. The 4G standard is, for example, a third generation partnership project (3GPP) (registered trademark) long term evolution (LTE) standard (registered trademark). The 5G standard is, for example, 5G new radio (NR). The high frequency module 8 is a module compatible with carrier aggregation and dual connectivity.

The high frequency module 8 is configured to amplify a reception signal (high frequency signal) received by an antenna 91 described later and output the amplified reception signal to a signal processing circuit 92 described later. In addition, the high frequency module 8 is configured to amplify a transmission signal from the signal processing circuit 92 and output the amplified transmission signal to the antenna 91. The high frequency module 8 is controlled by, for example, the signal processing circuit 92.

(2) Communication Device

As illustrated in FIG. 21, the communication device 9 according to Example Embodiment 6 includes the high frequency module 8, at least one (in the illustrated example, one) antenna 91, and the signal processing circuit 92. The communication device 9 is, for example, a mobile terminal (for example, a smartphone), but is not limited to the mobile terminal, and may be, for example, a wearable terminal (for example, a smart watch).

The signal processing circuit 92 processes the high frequency signal (transmission signal and reception signal) passing through the high frequency module 8. More specifically, the signal processing circuit 92 is configured to perform signal processing on the reception signal received from the high frequency module 8. In addition, the signal processing circuit 92 is configured to perform signal processing on the transmission signal output to the high frequency module 8. The signal processing circuit 92 includes an RF signal processing circuit 93 and a baseband signal processing circuit 94.

The RF signal processing circuit 93 is, for example, a radio frequency integrated circuit (RFIC), and performs signal processing on the high frequency signal (reception signal). The RF signal processing circuit 93 performs signal processing such as, for example, down conversion on the reception signal received from the high frequency module 8, and outputs the processed reception signal to the baseband signal processing circuit 94. In addition, the RF signal processing circuit 93 performs signal processing such as, for example, up conversion on the transmission signal output from the baseband signal processing circuit 94 and outputs the processed transmission signal to the high frequency module 8.

The baseband signal processing circuit 94 is, for example, a baseband integrated circuit (BBIC). The baseband signal processing circuit 94 outputs the reception signal, which is received from the RF signal processing circuit 93, to the outside. For example, this output signal (the reception signal) is used for image display as an image signal, or is used for a call as an audio signal. In addition, the baseband signal processing circuit 94 generates the transmission signal from a baseband signal (for example, the audio signal and the image signal) input from the outside, and outputs the generated transmission signal to the RF signal processing circuit 93.

(3) Advantageous Effects

By applying the LC filter 1 according to Example Embodiment 1 as the filter 81 (low pass filter) in the high frequency module 8 and the communication device 9 according to Example Embodiment 6, it is possible to provide the high frequency module 8 and the communication device 9 having a low loss and high attenuation characteristics. That is, in the high frequency module 8 and the communication device 9, it is possible to improve the attenuation characteristics in the non-pass band while maintaining the loss with respect to the signal in the pass band to the same extent. Even in a case where any one of the LC filters 1A to 1C according to Example Embodiment 2 to 4 is applied as the filter 81, the same or substantially the same advantageous effects are obtained.

Example Embodiment 7

In Example Embodiment 7, a multiplexer 7B as illustrated in FIGS. 22 to 25 will be described.

(1) Structure of Multiplexer

Figure 22:
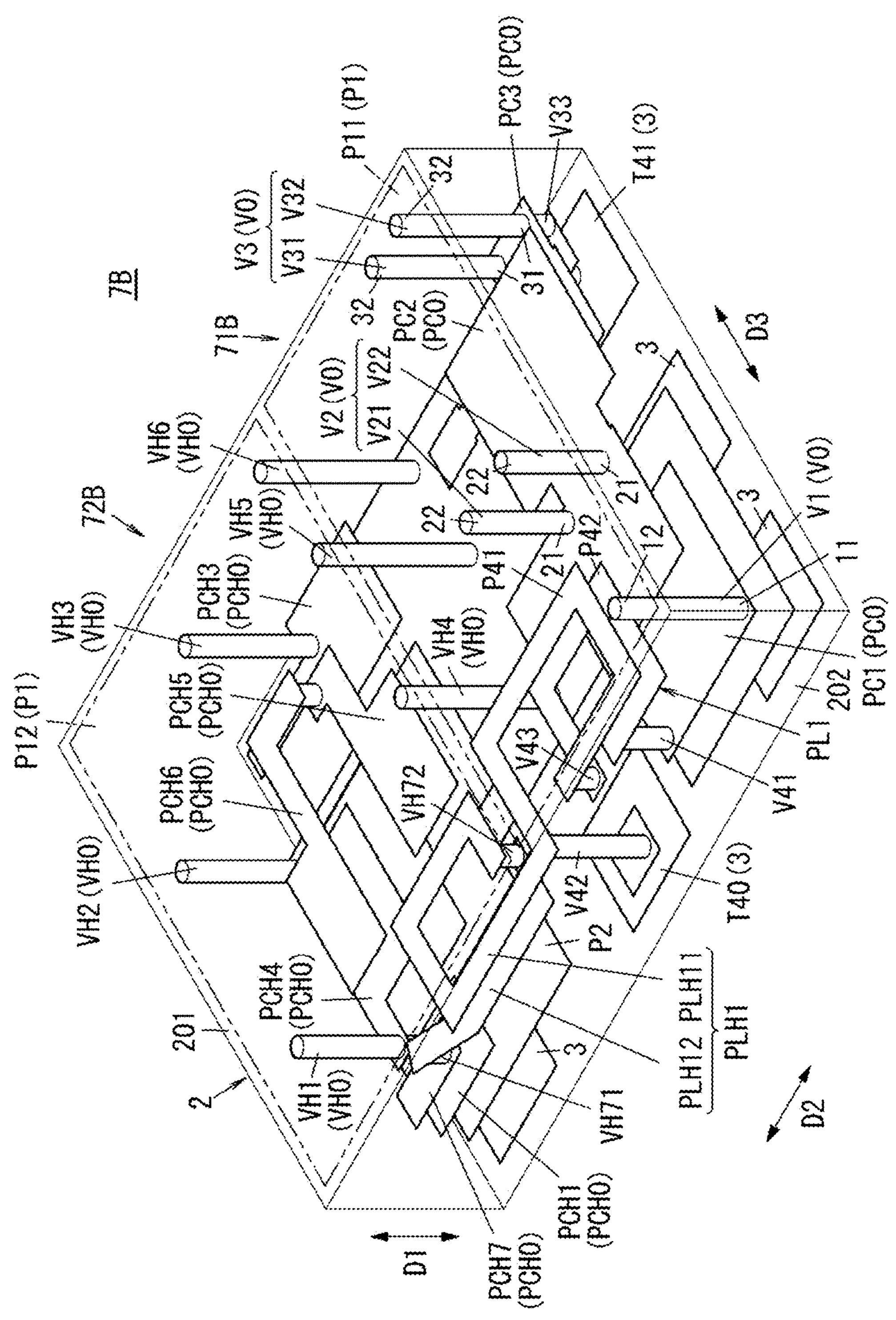
FIG. 22 is a transparent perspective view of a multiplexer according to Example Embodiment 7 of the present invention.
Figure 23:
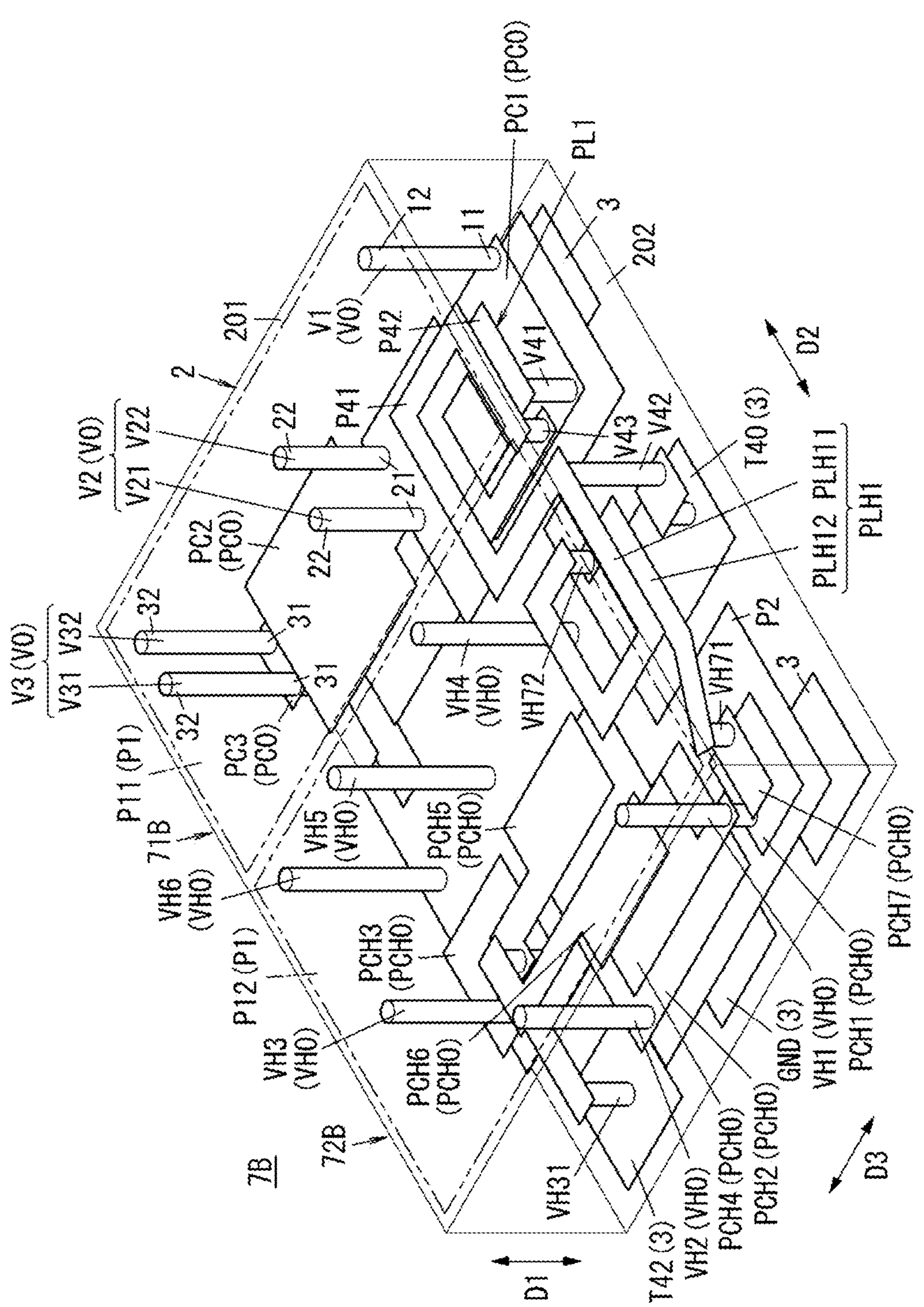
FIG. 23 is a transparent perspective view of the multiplexer of FIG. 22.
Figure 24:
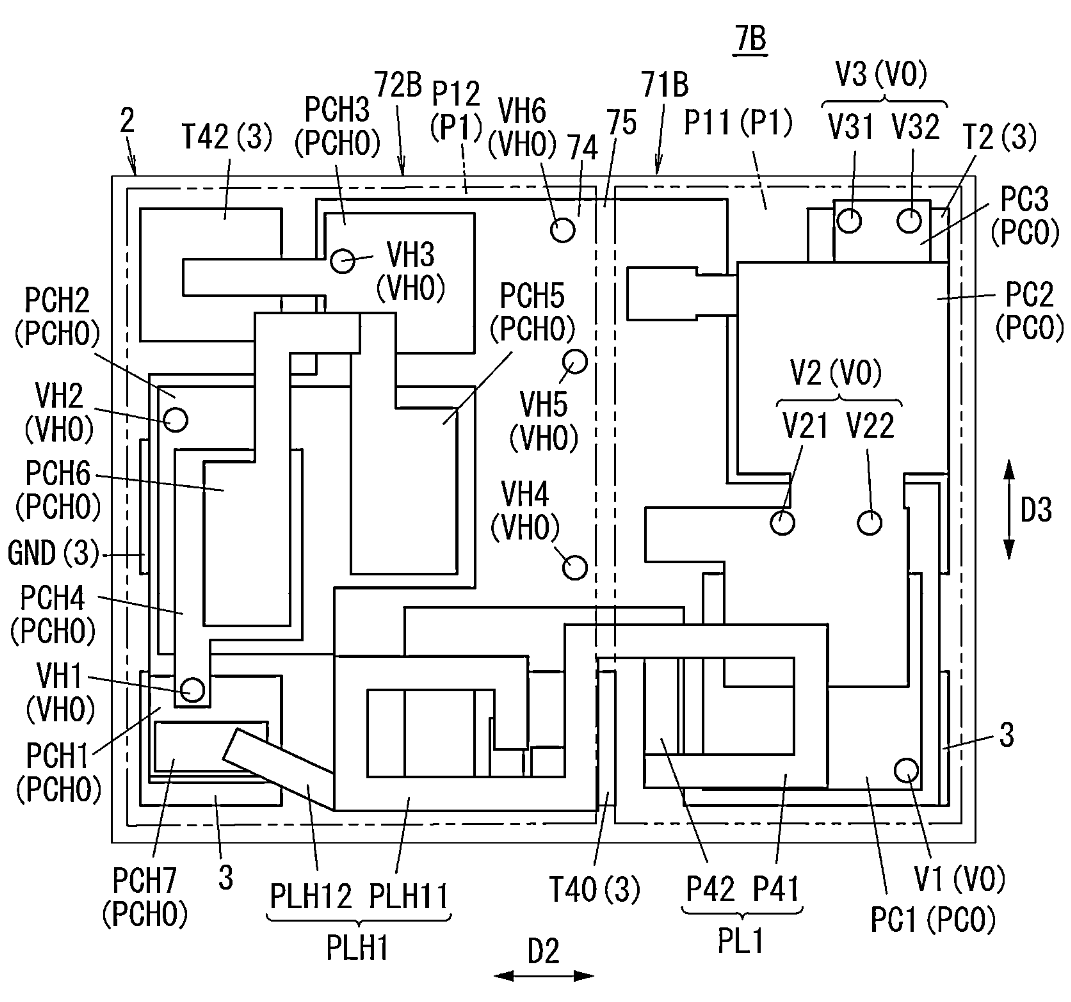
FIG. 24 is a transparent plan view of the multiplexer of FIG. 22.
Figure 25:
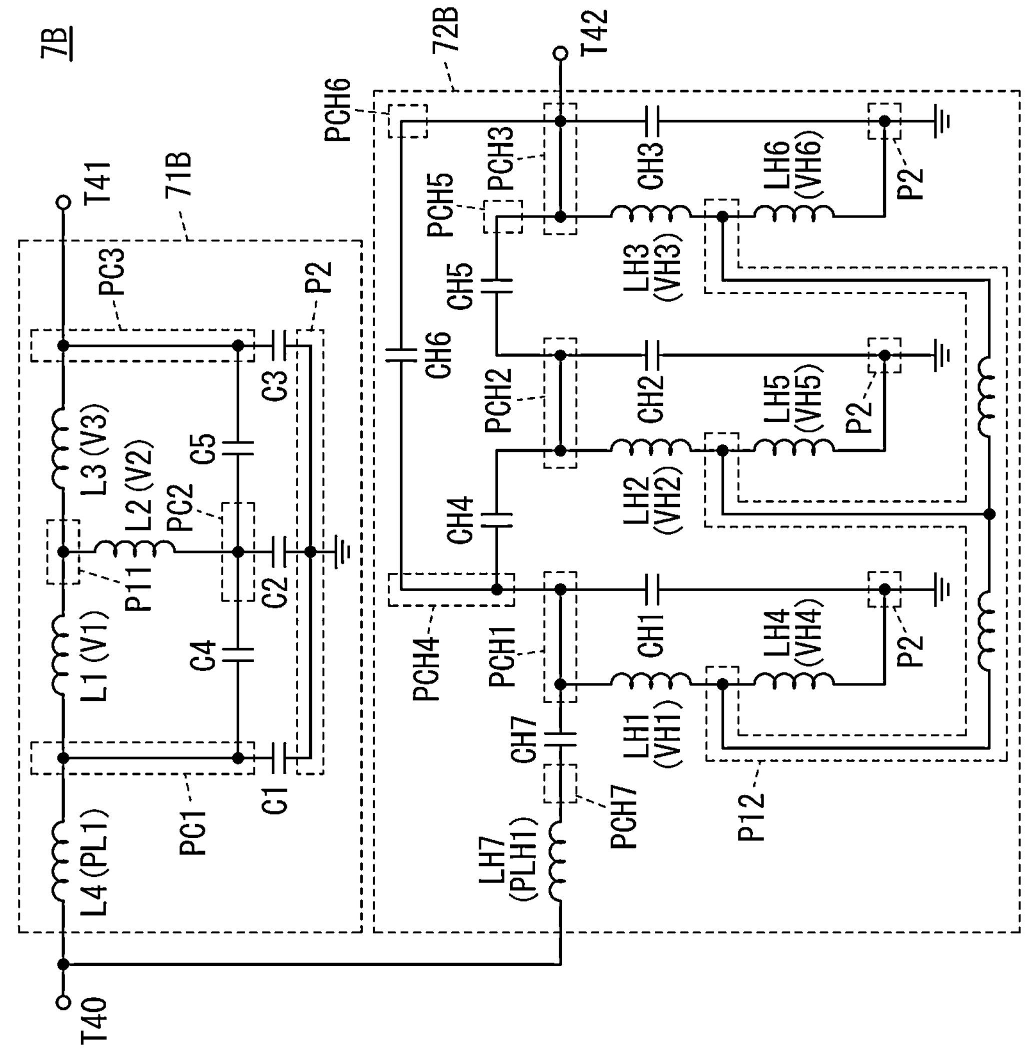
FIG. 25 is a circuit diagram of the multiplexer of FIG. 22.

As illustrated in FIGS. 22 to 24, the multiplexer 7B includes the multilayer body 2, the plurality of terminals 3, a plurality of (in the illustrated example, two) first electrodes P1, the second electrode P2, a plurality of capacitor electrodes PC0 and PCH0, and a plurality of inductor vias V0 and VH0. In addition, as illustrated in FIG. 25, the multiplexer 7B according to Example Embodiment 7 includes a first filter 71B and a second filter 72B.

(1.1) Multilayer Body

The multilayer body 2 illustrated in FIGS. 22 to 24 is a rectangular parallelepiped or a substantially rectangular parallelepiped, and is formed by laminating the plurality of dielectric layers (not illustrated) in the lamination direction. That is, the multilayer body 2 is a structure in which a plurality of dielectric layers are laminated. Each of the plurality of dielectric layers of the multilayer body 2 is made of, for example, a ceramic. An inductor and a capacitor are defined by a plurality of wiring pattern portions, a plurality of electrodes, and a plurality of vias (via conductors) provided in the dielectric layers inside the multilayer body 2. The multilayer body 2 is not limited to the rectangular parallelepiped or the substantially rectangular parallelepiped, and may be a solid having another shape.

The multilayer body 2 includes a first main surface 201 and a second main surface 202. The second electrode P2 is provided in a second dielectric layer (not illustrated) close to the second main surface 202 of the multilayer body 2. In addition, the plurality of first electrodes P1 are formed in a first dielectric layer (not illustrated) close to the first main surface 201 of the multilayer body 2. In FIGS. 22 to 24, the plurality of first electrodes P1 are illustrated by double-dotted chain lines.

(1.2) Terminal

The plurality of terminals 3 (common terminal T40, first terminal T41, second terminal T42, and ground terminal GND) are electrodes having a plate shape, and are provided in the multilayer body 2.

More specifically, the plurality of terminals 3 are disposed on the second main surface 202 of the multilayer body 2. The plurality of terminals 3 are, for example, LGA terminals regularly disposed on the second main surface 202 of the multilayer body 2. The plurality of terminals 3 are external terminals to connect the multiplexer 7B and an external device (not illustrated).

The plurality of terminals 3 include the common terminal T40, the first terminal T41, and the second terminal T42. The plurality of terminals 3 are external terminals to connect the multiplexer 7B and an external device (not illustrated).

(1.3) First Electrode and Second Electrode

As illustrated in FIGS. 22 to 24, the plurality of first electrodes P1 are provided in the first dielectric layer (not illustrated) among the plurality of dielectric layers of the multilayer body 2. Each of the plurality of first electrodes P1 is a plate electrode having a plate shape. In plan view in the lamination direction (first direction D1) of the multilayer body 2, each first electrode P1 has a rectangular or substantially rectangular shape. As illustrated in FIG. 25, among the plurality of first electrodes P1, a first electrode P11 is an electrode for the first filter 71B, and a first electrode P12 is an electrode for the second filter 72B.

The second electrode P2 is provided in the second dielectric layer (not illustrated) different from the first dielectric layer among the plurality of dielectric layers of the multilayer body 2. The second electrode P2 is a plate electrode having a plate shape. The second electrode P2 is connected to the ground terminal GND. More specifically, the second electrode P2 is connected to the ground terminal GND disposed on the second main surface 202 of the multilayer body 2 with a via (not illustrated) interposed therebetween.

From the above, the first filter 71B and the second filter 72B are connected to the common ground terminal GND with the second electrode P2 interposed therebetween.

(1.4) Capacitor Electrode of First Filter

As illustrated in FIGS. 22 to 24, the first filter 71B includes the first capacitor electrode PC1, the second capacitor electrode PC2, and the third capacitor electrode PC3, as the plurality of capacitor electrodes PC0.

The first capacitor electrode PC1 has a plate shape, and is provided in the dielectric layer (not illustrated) between the first electrode P11 and the second electrode P2 in the first direction D1. The first capacitor electrode PC1 is spaced apart from the second electrode P2, and defines the first capacitor C1 (see FIG. 25) with the second electrode P2. The first capacitor electrode PC1 is connected to a first inductor pattern portion PL1.

The second capacitor electrode PC2 has a plate shape, and is provided in the dielectric layer (not illustrated) between the first electrode P11 and the second electrode P2 in the first direction D1. More specifically, the second capacitor electrode PC2 includes the first portion PC21 and the second portion PC22. The second capacitor electrode PC2 is spaced apart from the second electrode P2, and defines the second capacitor C2 (see FIG. 25) with the second electrode P2.

The third capacitor electrode PC3 has a plate shape, and is provided in the dielectric layer (not illustrated) between the first electrode P11 and the second electrode P2 in the first direction D1. The third capacitor electrode PC3 is spaced apart from the second electrode P2, and defines the third capacitor C3 (see FIG. 25) with the second electrode P2. The third capacitor electrode PC3 is connected to the first terminal T41 with the via conductor V33 interposed therebetween.

The first capacitor electrode PC1 and the second capacitor electrode PC2 define the fourth capacitor C4 (see FIG. 25). The second capacitor electrode PC2 and the third capacitor electrode PC3 define the fifth capacitor C5 (see FIG. 25). More specifically, the first portion PC21 of the second capacitor electrode PC2 and the first capacitor electrode PC1 define the fourth capacitor C4. The second portion PC22 of the second capacitor electrode PC2 and the third capacitor electrode PC3 define the fifth capacitor C5.

The first capacitor electrode PC1, the second capacitor electrode PC2, and the third capacitor electrode PC3 are provided between the first electrode P11 and the second electrode P2 in the lamination direction (first direction D1) of the multilayer body 2. In plan view in the lamination direction of the multilayer body 2, a portion of the first capacitor electrode PC1 may overlap with the first electrode P11 and the second electrode P2, or the entire or substantially the entire first capacitor electrode PC1 may overlap with the first electrode P11 and the second electrode P2. In other words, the first capacitor electrode PC1 is provided between the first electrode P11 and the second electrode P2 such that at least a portion of the first capacitor electrode PC1 overlaps with the first electrode P11 and the second electrode P2 in plan view in the lamination direction of the multilayer body 2. In addition, in plan view in the lamination direction of the multilayer body 2, a portion of the second capacitor electrode PC2 may overlap with the first electrode P11 and the second electrode P2, or the entire or substantially the entire second capacitor electrode PC2 may overlap with the first electrode P11 and the second electrode P2. In other words, the second capacitor electrode PC2 is provided between the first electrode P11 and the second electrode P2 such that at least a portion of the second capacitor electrode PC2 overlaps with the first electrode P11 and the second electrode P2 in plan view in the lamination direction of the multilayer body 2. Further, in plan view in the lamination direction of the multilayer body 2, a portion of the third capacitor electrode PC3 may overlap with the first electrode P11 and the second electrode P2, or the entire or substantially the entire third capacitor electrode PC3 may overlap with the first electrode P11 and the second electrode P2. In other words, the third capacitor electrode PC3 is provided between the first electrode P11 and the second electrode P2 such that at least a portion of the third capacitor electrode PC3 overlaps with the first electrode P11 and the second electrode P2 in plan view in the lamination direction of the multilayer body 2.

(1.5) Inductor Via of First Filter

As illustrated in FIGS. 22 to 24, the first filter 71B includes the first inductor via V1, the second inductor via V2, and the third inductor via V3, as the plurality of inductor vias V0.

The first inductor via V1 is connected between the first capacitor electrode PC1 and the first electrode P11. More specifically, the first inductor via V1 includes the first end 11 and the second end 12. The first end 11 of the first inductor via V1 is connected to the first capacitor electrode PC1. The second end 12 of the first inductor via V1 is connected to the first electrode P11. The first inductor via V1 defines the first inductor L1 (see FIG. 25).

The second inductor via V2 is connected between the second capacitor electrode PC2 and the first electrode P11. More specifically, the second inductor via V2 has the third end 21 and the fourth end 22. The third end 21 of the second inductor via V2 is connected to the second capacitor electrode PC2. The fourth end 22 of the second inductor via V2 is connected to the first electrode P11. The second inductor via V2 defines the second inductor L2 (see FIG. 25). The second inductor via V2 includes the plurality of (in the illustrated example, two) via conductors V21 and V22 extending in the lamination direction (first direction D1) of the multilayer body 2. The plurality of via conductors V21 and V22 are connected in parallel between the second capacitor electrode PC2 and the first electrode P11. In addition, the plurality of via conductors V21 and V22 are arranged along the second direction D2.

The third inductor via V3 is connected between the third capacitor electrode PC3 and the first electrode P11. More specifically, the third inductor via V3 includes the fifth end 31 and the sixth end 32. The fifth end 31 of the third inductor via V3 is connected to the third capacitor electrode PC3. The sixth end 32 of the third inductor via V3 is connected to the first electrode P11. The third inductor via V3 defines the third inductor L3 (see FIG. 25). The third inductor via V3 includes the plurality of (in the illustrated example, two) via conductors V31 and V32 extending in the lamination direction (first direction D1) of the multilayer body 2. The plurality of via conductors V31 and V32 are connected in parallel between the third capacitor electrode PC3 and the first electrode P11. In addition, the plurality of via conductors V31 and V32 are arranged along the second direction D2.

(1.6) Inductor Pattern Portion of First Filter

As illustrated in FIGS. 22 to 24, the first inductor pattern portion PL1 includes a first end connected to the first capacitor electrode PC1, and a second end connected to the common terminal T40. The first inductor pattern portion PL1 defines the fourth inductor L4 (see FIG. 25).

More specifically, the first inductor pattern portion PL1 includes the plurality of (in the illustrated example, two) pattern portions P41 and P42, and the plurality of (in the illustrated example, three) via conductors V41 to V43. The pattern portion P42 is connected to the first capacitor electrode PC1 with the via conductor V41 interposed therebetween. The pattern portion P41 is connected to the common terminal T40 with the via conductor V42 interposed therebetween. In addition, the pattern portion P41 and the pattern portion P42 are connected by the via conductor V43, and are arranged along the first direction D1. The via conductor V41 corresponds to the first end of the first inductor pattern portion PL1, and the via conductor V42 corresponds to the second end of the first inductor pattern portion PL1. The pattern portion P41 is provided in a wound state on a plane in one dielectric layer (not illustrated) among the plurality of dielectric layers of the multilayer body 2. The pattern portion P42 is provided in a wound state on a plane in one dielectric layer (not illustrated) different from the dielectric layer provided with the pattern portion P41 among the plurality of dielectric layers of the multilayer body 2.

The first inductor pattern portion PL1 defines a helical coil. The helical coil is a coil including one or more turns. More preferably, the helical coil is a coil including two or more turns. In the first inductor pattern portion PL1, a distance between the pattern portion P41 and the pattern portion P42, that is, a layer-to-layer distance of the helical coil is, for example, about 50 μm or more.

(1.7) Capacitor Electrode of Second Filter

As illustrated in FIGS. 22 to 24, the second filter 72B includes a first capacitor electrode PCH1, a second capacitor electrode PCH2, a third capacitor electrode PCH3, a fourth capacitor electrode PCH4, a fifth capacitor electrode PCH5, a sixth capacitor electrode PCH6, and a seventh capacitor electrode PCH7, as the plurality of capacitor electrodes PCH0.

The first capacitor electrode PCH1 has a plate shape, and is provided in the dielectric layer (not illustrated) between the first electrode P12 and the second electrode P2 in the first direction D1. The first capacitor electrode PCH1 is spaced apart from the second electrode P2, and defines a first capacitor CH1 (see FIG. 25) with the second electrode P2. The first capacitor electrode PCH1 is connected to a first inductor via VH1.

The second capacitor electrode PCH2 has a plate shape, and is provided in the dielectric layer (not illustrated) between the first electrode P12 and the second electrode P2 in the first direction D1. The second capacitor electrode PCH2 is spaced apart from the second electrode P2, and defines a second capacitor CH2 (see FIG. 25) with the second electrode P2. The second capacitor electrode PCH2 is connected to a second inductor via VH2.

The third capacitor electrode PCH3 has a plate shape, and is provided in the dielectric layer (not illustrated) between the first electrode P12 and the second electrode P2 in the first direction D1. The third capacitor electrode PCH3 is spaced apart from the second electrode P2, and defines a third capacitor CH3 (see FIG. 25) with the second electrode P2. The third capacitor electrode PCH3 is connected to the second terminal T42 with a via conductor VH31 interposed therebetween.

The fourth capacitor electrode PCH4 has a plate shape, and is provided in the dielectric layer (not illustrated) between the first electrode P12 and the second electrode P2 in the first direction D1. The fourth capacitor electrode PCH4 is spaced apart from the second capacitor electrode PCH2, and defines a fourth capacitor CH4 (see FIG. 25) with the second capacitor electrode PCH2.

The fifth capacitor electrode PCH5 has a plate shape, and is provided in the dielectric layer (not illustrated) between the first electrode P12 and the second electrode P2 in the first direction D1. The fifth capacitor electrode PCH5 is spaced apart from the second capacitor electrode PCH2, and defines a fifth capacitor CH5 (see FIG. 25) with the second capacitor electrode PCH2.

The sixth capacitor electrode PCH6 has a plate shape, and is provided in the dielectric layer (not illustrated) between the first electrode P12 and the second electrode P2 in the first direction D1. The sixth capacitor electrode PCH6 is spaced apart from the fourth capacitor electrode PCH4, and defines a sixth capacitor CH6 (see FIG. 25) with the fourth capacitor electrode PCH4.

The seventh capacitor electrode PCH7 has a plate shape, and is provided in the dielectric layer (not illustrated) between the first electrode P12 and the second electrode P2 in the first direction D1. The seventh capacitor electrode PCH7 is spaced apart from the first capacitor electrode PCH1, and defines a seventh capacitor CH7 (see FIG. 25) with the first capacitor electrode PCH1. The seventh capacitor electrode PCH7 is connected to a via conductor VH71.

(1.8) Inductor Via of Second Filter

As illustrated in FIGS. 22 to 24, the second filter 72B includes the first inductor via VH1, the second inductor via VH2, the third inductor via VH3, a fourth inductor via VH4, a fifth inductor via VH5, and a sixth inductor via VH6, as a plurality of inductor vias VH0.

The first inductor via VH1 is connected between the first capacitor electrode PCH1 and the first electrode P12. The first inductor via VH1 defines a first inductor LH1 (see FIG. 25).

The second inductor via VH2 is connected between the second capacitor electrode PCH2 and the first electrode P12. The second inductor via VH2 defines a second inductor LH2 (see FIG. 25).

The third inductor via VH3 is connected between the third capacitor electrode PCH3 and the first electrode P12. The third inductor via VH3 defines a third inductor LH3 (see FIG. 25).

The fourth inductor via VH4 is connected between the first electrode P12 and the second electrode P2. The fourth inductor via VH4 defines a fourth inductor LH4 (see FIG. 25).

The fifth inductor via VH5 is connected between the first electrode P12 and the second electrode P2. The fifth inductor via VH5 defines a fifth inductor LH5 (see FIG. 25).

The sixth inductor via VH6 is connected between the first electrode P12 and the second electrode P2. The sixth inductor via VH6 defines a sixth inductor LH6 (see FIG. 25).

(1.9) Inductor Pattern Portion of Second Filter

As illustrated in FIGS. 22 to 24, an inductor pattern portion PLH1 includes a first end connected to the seventh capacitor electrode PCH7, and a second end connected to the common terminal T40. The inductor pattern portion PLH1 defines a seventh inductor LH7 (see FIG. 25).

More specifically, the inductor pattern portion PLH1 includes a plurality of (in the illustrated example, two) pattern portions PLH11 and PLH12, and a plurality of (in the illustrated example, two) via conductors VH71 and VH72. The pattern portion PLH11 is connected to the common terminal T40 with the via conductor V42 interposed therebetween. The pattern portion PLH12 is connected to the seventh capacitor electrode PCH7 with the via conductor VH71 interposed therebetween. In addition, the pattern portion PLH11 and the pattern portion PLH12 are connected by the via conductor VH72 and are arranged along the first direction D1. The via conductor VH71 corresponds to the first end of the inductor pattern portion PLH1, and the via conductor V42 corresponds to the second end of the inductor pattern portion PLH1. The pattern portion PLH11 is provided in a wound state on a plane in one dielectric layer (not illustrated) among the plurality of dielectric layers of the multilayer body 2. The pattern portion PLH12 is provided in a wound state on a plane in one dielectric layer (not illustrated) different from the dielectric layer provided with the pattern portion PLH11 among the plurality of dielectric layers of the multilayer body 2.

The inductor pattern portion PLH1 defines a helical coil. The helical coil is a coil including one or more turns. More preferably, the helical coil is a coil including two or more turns. In the inductor pattern portion PLH1, a distance between the pattern portion PLH11 and the pattern portion PLH12, that is, a layer-to-layer distance of the helical coil is, for example, about 50 μm or more.

(1.10) Disposition of Plurality of Inductor Vias in Second Filter

As illustrated in FIGS. 22 to 24, in the second filter 72B, the first inductor via VH1 to the third inductor via VH3 are not directly connected to the second electrode P2, which is a ground potential. The first inductor via VH1 is connected to the first capacitor electrode PCH1, the second inductor via VH2 is connected to the second capacitor electrode PCH2, and the third inductor via VH3 is connected to the third capacitor electrode PCH3. The first capacitor electrode PCH1 to the third capacitor electrode PCH3 face the second electrode P2. The first inductor via VH1 to the third inductor via VH3 are referred to as open-end vias. The first inductor LH1 to the third inductor LH3 are referred to as open-end coils. On the other hand, the fourth inductor via VH4 to the sixth inductor via VH6 are directly connected to the second electrode P2, which is a ground potential. The fourth inductor via VH4 to the sixth inductor via VH6 are referred to as short-circuit end vias. The fourth inductor LH4 to the sixth inductor LH6 are referred to as short-circuit end coils.

The fourth inductor via VH4 to the sixth inductor via VH6 are disposed in a boundary region 74 between the first filter 71B and the second filter 72B. More specifically, the fourth inductor via VH4 to the sixth inductor via VH6 are disposed on the first filter 71B side with respect to the first inductor via VH1 to the third inductor via VH3. In addition, the fourth inductor via VH4 to the sixth inductor via VH6 are arranged along the third direction D3. Here, the boundary region 74 is a region that is close to a boundary 75 between the first electrode P11 and the first electrode P12 in the second direction D2 among regions overlapping with the first electrode P12 in plan view in the lamination direction (first direction D1) of the multilayer body 2.

A current flows from the first capacitor CH1 to the third capacitor CH3 toward the first inductor LH1 (first inductor via VH1) to the third inductor LH3 (third inductor via VH3), and the fourth inductor LH4 (fourth inductor via VH4) to the sixth inductor LH6 (sixth inductor via VH6). That is, the current flows from the open-end coil (open-end via) toward the short-circuit end coil (short-circuit end via). As a result, since the current flowing through the fourth inductor vias VH4 to the sixth inductor vias VH6 and the current flowing through the first inductor vias V1 to the third inductor vias V3 of the first filter 71B are in the opposite directions, the deterioration in the isolation between the first filter 71B and the second filter 72B can be reduced or prevented.

(2) Circuit Configuration of Multiplexer

The multiplexer 7B according to Example Embodiment 7 includes the common terminal T40, the first terminal T41, the second terminal T42, the first filter 71B, and the second filter 72B, as illustrated in FIG. 25.

(2.1) Circuit Configuration of First Filter

The first filter 71B is connected between the common terminal T40 and the first terminal T41. The first filter 71B is a low pass filter (LPF) that allows a signal in a frequency band lower than a predetermined frequency to pass therethrough.

The first filter 71B includes the first capacitor C1, the second capacitor C2, the third capacitor C3, the fourth capacitor C4, the fifth capacitor C5, the first inductor L1, the second inductor L2, the third inductor L3, and the fourth inductor L4. The description of the same or similar configuration as the configuration of the LC filter 1 according to Example Embodiment 1 will be omitted.

(2.2) Circuit Configuration of Second Filter

The second filter 72B is connected between the common terminal T40 and the second terminal T42. The second filter 72B is, for example, a band pass filter or a high pass filter that allows a signal in a frequency band higher than a pass band of the first filter 71B to pass therethrough.

The second filter 72B includes the first capacitor CH1 (first capacitor for the second filter), the second capacitor CH2 (second capacitor for the second filter), the third capacitor CH3 (third capacitor for the second filter), the fourth capacitor CH4, the fifth capacitor CH5, and the sixth capacitor CH6. In addition, the second filter 72B includes the first inductor LH1 (first inductor for the second filter), the second inductor LH2 (second inductor for the second filter), the third inductor LH3 (third inductor for the second filter), the fourth inductor LH4, the fifth inductor LH5, and the sixth inductor LH6. Further, the second filter 72B includes a seventh inductor LH7 (seventh inductor for the second filter) and a seventh capacitor CH7 (series capacitor for the second filter).

(2.2.1) First Capacitor, First Inductor, and Fourth Inductor

The first capacitor CH1 is defined between the first capacitor electrode PCH1 and the second electrode P2. The first capacitor CH1 is provided by a capacitance coupling between the first capacitor electrode PCH1 and the second electrode P2. The first inductor LH1 is connected between the first capacitor electrode PCH1 and the first electrode P12. The first inductor LH1 corresponds to the first inductor via VH1. The fourth inductor LH4 is connected between the first electrode P12 and the second electrode P2. The fourth inductor LH4 corresponds to the fourth inductor via VH4.

(2.2.2) Second Capacitor, Second Inductor, and Fifth Inductor

The second capacitor CH2 is defined between the second capacitor electrode PCH2 and the second electrode P2. The second capacitor CH2 is provided by a capacitance coupling between the second capacitor electrode PCH2 and the second electrode P2. The second inductor LH2 is connected between the second capacitor electrode PCH2 and the first electrode P12. The second inductor LH2 corresponds to the second inductor via VH2. The fifth inductor LH5 is connected between the first electrode P12 and the second electrode P2. The fifth inductor LH5 corresponds to the fifth inductor via VH5.

(2.2.3) Third Capacitor, Third Inductor, and Sixth Inductor

The third capacitor CH3 is defined between the third capacitor electrode PCH3 and the second electrode P2. The third capacitor CH3 is provided by a capacitance coupling between the third capacitor electrode PCH3 and the second electrode P2. The third capacitor CH3 is connected to the second terminal T42. The third inductor LH3 is connected between the third capacitor electrode PCH3 and the first electrode P12. The third inductor LH3 corresponds to the third inductor via VH3. The sixth inductor LH6 is connected between the first electrode P12 and the second electrode P2. The sixth inductor LH6 corresponds to the sixth inductor via VH6.

(2.2.4) Fourth Capacitor, Fifth Capacitor, and Sixth Capacitor

The fourth capacitor CH4 is defined between the second capacitor electrode PCH2 and the fourth capacitor electrode PCH4. The fourth capacitor CH4 is provided by a capacitance coupling between the second capacitor electrode PCH2 and the fourth capacitor electrode PCH4.

The fifth capacitor CH5 is defined between the second capacitor electrode PCH2 and the fifth capacitor electrode PCH5. The fifth capacitor CH5 is provided by a capacitance coupling between the second capacitor electrode PCH2 and the fifth capacitor electrode PCH5.

The sixth capacitor CH6 is defined between the fourth capacitor electrode PCH4 and the sixth capacitor electrode PCH6. The sixth capacitor CH6 is provided by a capacitance coupling between the fourth capacitor electrode PCH4 and the sixth capacitor electrode PCH6.

(2.2.5) Seventh Inductor and Seventh Capacitor

The seventh inductor LH7 is connected between the common terminal T40 and the seventh capacitor CH7. The seventh inductor LH7 corresponds to the inductor pattern portion PLH1.

The seventh capacitor CH7 is connected between the seventh capacitor electrode PCH7 and the first capacitor electrode PCH1. The seventh capacitor CH7 is provided by a capacitance coupling between the seventh capacitor electrode PCH7 and the first capacitor electrode PCH1. The seventh capacitor CH7 is connected in series to the seventh inductor LH7.

(3) Advantageous Effects

In the multiplexer 7B according to Example Embodiment 7, the fourth inductor via VH4 to the sixth inductor via VH6 of the second filter 72B are disposed in the boundary region 74 between the first filter 71B and the second filter 72B. As a result, the deterioration in the isolation between the first filter 71B and the second filter 72B can be reduced or prevented.

Example Embodiment 8

Figure 26:
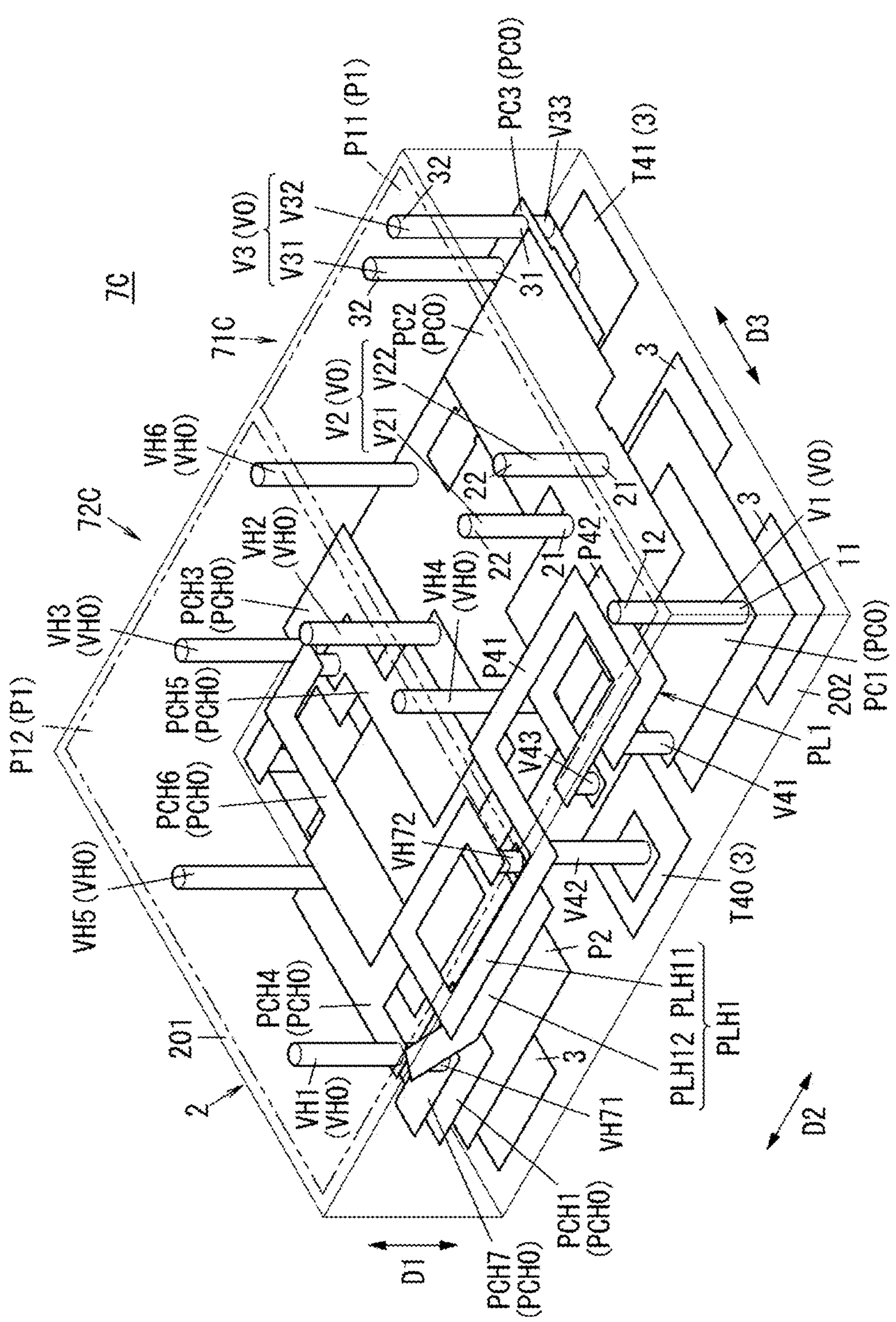
FIG. 26 is a transparent perspective view of a multiplexer according to Example Embodiment 8 of the present invention.
Figure 27:
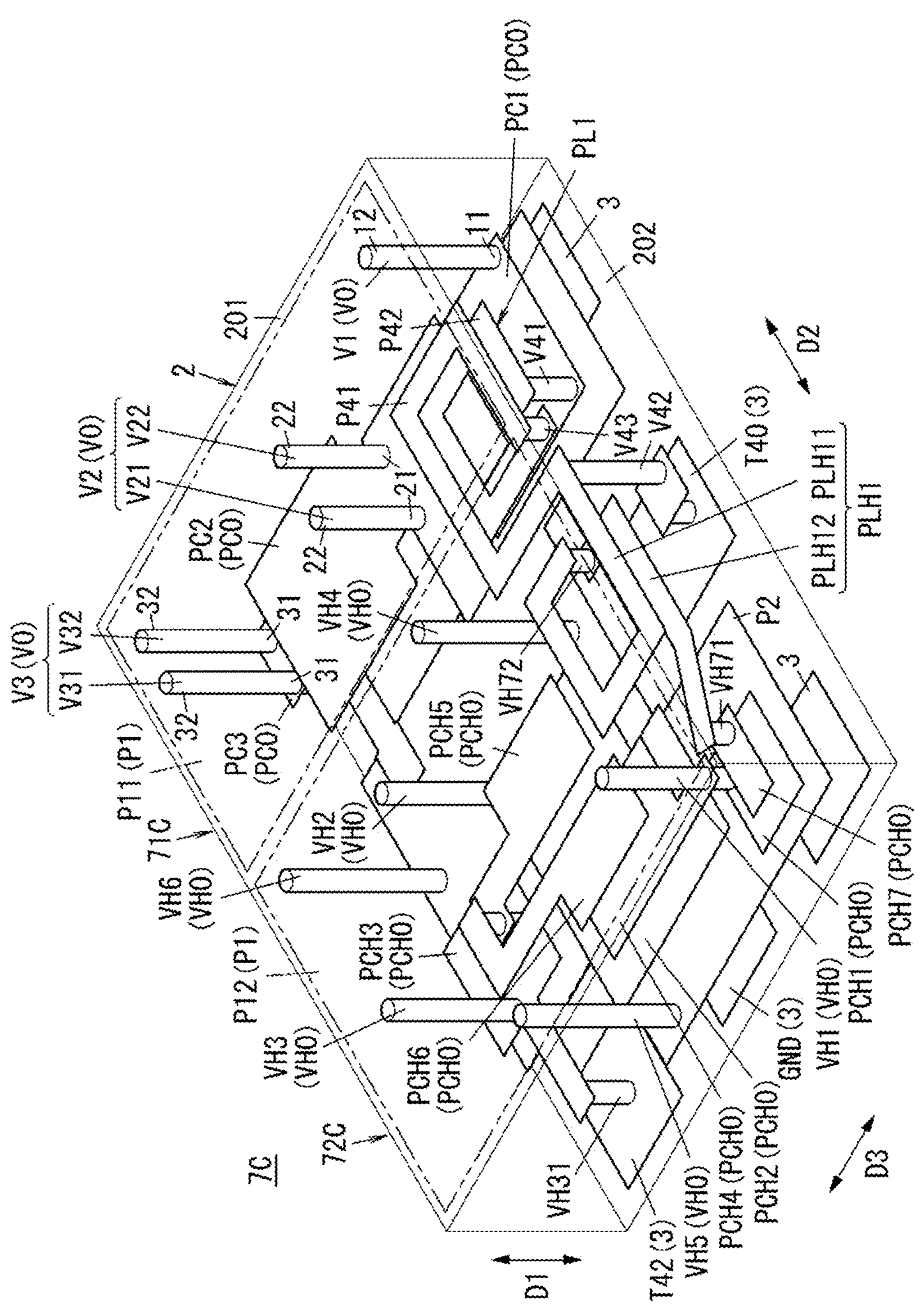
FIG. 27 is a transparent perspective view of the multiplexer of FIG. 26.

A multiplexer 7C according to Example Embodiment 8 of the present invention is different from the multiplexer 7B (see FIGS. 22 to 24) according to Example Embodiment 7 in that a plurality of inductor vias VH0 are disposed as illustrated in FIGS. 26 and 27. Regarding the multiplexer 7C according to Example Embodiment 8, the same or corresponding components as the components of the multiplexer 7B according to Example Embodiment 7 are designated by the same reference numerals, and the description thereof will be omitted.

(1) Structure of Multiplexer

The multiplexer 7C according to Example Embodiment 8 includes the multilayer body 2, the plurality of terminals 3, the plurality of first electrodes P11 and P12, the plurality of capacitor electrodes PC0, and the plurality of inductor vias VH0, as illustrated in FIGS. 26 and 27, as in the multiplexer 7B according to Example Embodiment 7. In addition, the multiplexer 7C according to Example Embodiment 8 includes a first filter 71C and a second filter 72C, as illustrated in FIGS. 26 and 27, as in the multiplexer 7B according to Example Embodiment 7.

(1.1) Inductor Via of Second Filter

The second filter 72C according to Example Embodiment 8 includes the first inductor via VH1, the second inductor via VH2, the third inductor via VH3, the fourth inductor via VH4, the fifth inductor via VH5, and the sixth inductor via VH6, as the plurality of inductor vias VH0, as illustrated in FIGS. 26 and 27, as in the multiplexer 7B (see FIGS. 22 to 24) according to Example Embodiment 7.

(1.2) Disposition of Plurality of Inductor Vias in Second Filter

As illustrated in FIGS. 26 and 27, in the second filter 72C according to Example Embodiment 8, as in Example Embodiment 7, the first inductor via VH1 to the third inductor via VH3 are not directly connected to the second electrode P2, which is a ground potential, and are connected to the first capacitor electrode PCH1 to the third capacitor electrode PCH3, and the first capacitor electrode PCH1 to the third capacitor electrode PCH3 face the second electrode P2. On the other hand, the fourth inductor via VH4 to the sixth inductor via VH6 are directly connected to the second electrode P2, which is a ground potential.

In Example Embodiment 8, the first inductor via VH1 to the third inductor via VH3 are disposed in a staggered structure. In addition, the fourth inductor via VH4 to the sixth inductor via VH6 are disposed in a staggered structure. More specifically, the fourth inductor via VH4 and the sixth inductor via VH6, and the second inductor via VH2 are disposed in the boundary region 74 between the first filter 71C and the second filter 72C. More specifically, the fourth inductor via VH4, the sixth inductor via VH6, and the second inductor via VH2 are disposed on the first filter 71C side with respect to the first inductor via VH1, the third inductor via VH3, and the fifth inductor via VH5. In addition, the fourth inductor via VH4, the second inductor via VH2, and the sixth inductor via VH6 are arranged along the third direction D3.

(2) Advantageous Effects

Also in the multiplexer 7C according to Example Embodiment 8, in the boundary region 74 between the first filter 71C and the second filter 72C, the number of short-circuit end vias (fourth inductor via VH4 and sixth inductor via VH6) is larger than the number of open-end vias (second inductor via VH2). As a result, since the current flowing through the fourth inductor vias VH4 and the sixth inductor vias VH6 and the current flowing through the first inductor vias V1 to the third inductor vias V3 of the first filter 71C are in the opposite directions, the deterioration in the isolation between the first filter 71C and the second filter 72C can be reduced or prevented.

Example Embodiment 9

A multiplexer 7B (see FIG. 25) according to Example Embodiment 9 of the present invention is different from the multiplexer 7B according to Example Embodiment 7 in that the inductance of the fourth inductor L4 of the first filter 71B and the inductance of the seventh inductor LH7 of the second filter 72B are large. Regarding the multiplexer 7B according to Example Embodiment 9, the same or corresponding components as the components of the multiplexer 7B according to Example Embodiment 7 are designated by the same reference numerals, and the description thereof will be omitted.

(1) Circuit Configuration of Multiplexer

The multiplexer 7B according to Example Embodiment 9 includes the first filter 71B and the second filter 72B, as in the multiplexer 7B according to Example Embodiment 7.

The first filter 71B according to Example Embodiment 9 includes the first capacitor C1 to the fifth capacitor C5, and the first inductor L1 to the fourth inductor L4, as in the first filter 71B according to Example Embodiment 7. The description of the same or similar configuration as the configuration of the first filter 71B according to Example Embodiment 7 will be omitted.

The second filter 72B according to Example Embodiment 9 includes the first capacitor CH1 to the seventh capacitor CH7, and the first inductor LH1 to the seventh inductor LH7, as in the second filter 72B according to Example Embodiment 7. The description of the same or similar configuration as the configuration of the second filter 72B according to Example Embodiment 7 will be omitted.

In the first filter 71B according to Example Embodiment 9, the inductance of the fourth inductor L4 is larger than the inductance of each of the first inductor L1 to the third inductor L3. The fourth inductor L4 is provided in the first inductor pattern portion PL1, and thus it is possible to increase the inductance as compared with a case of being formed by the inductor via.

In the second filter 72B according to Example Embodiment 9, the inductance of the seventh inductor LH7 is larger than the inductance of each of the first inductor LH1 to the sixth inductor LH6. The seventh inductor LH7 is provided in the inductor pattern portion PLH1, and thus it is possible to increase the inductance as compared with a case of being defined by the inductor via.

Figure 28:
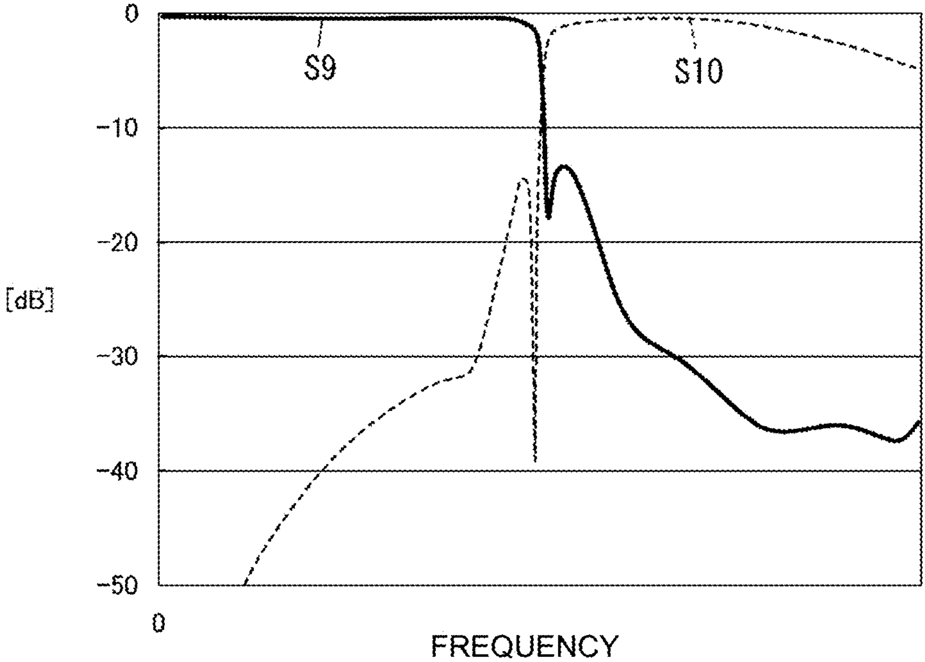
FIG. 28 is a characteristic diagram of a multiplexer according to Example Embodiment 9 of the present invention.

In the multiplexer 7B according to Example Embodiment 9, the bandpass characteristics as illustrated in FIG. 28 can be obtained. FIG. 28 illustrates the bandpass characteristics (solid line S9) of the first filter 71B and the bandpass characteristics (broken line S10) of the second filter 72B.

In the first filter 71B, in the non-pass band on the high frequency side with respect to the pass band of the first filter 71B, the attenuation is obtained. On the other hand, in the second filter 72B, in the non-pass band on the low frequency side with respect to a pass band of the second filter 72B, the attenuation is obtained.

(2) Advantageous Effects

In the multiplexer 7B according to Example Embodiment 9, the inductance of the fourth inductor L4 of the first filter 71B is larger than the inductance of each of the first inductor L1 to the third inductor L3. The inductance of the seventh inductor LH7 of the second filter 72B is larger than the inductance of each of the first inductor LH1 to the sixth inductor LH6. As a result, the characteristics of the multiplexer 7B can be improved.

(3) Modified Example

In a modified example of Example Embodiment 9, the configuration is not limited to the configuration in which both of the inductance of the fourth inductor L4 of the first filter 71B and the inductance of the seventh inductor LH7 of the second filter 72B are large, and only the inductance of the fourth inductor L4 of the first filter 71B may be large. More specifically, the inductance of the fourth inductor L4 is larger than the inductance of each of the first inductor L1 to the third inductor L3. Alternatively, only the inductance of the seventh inductor LH7 of the second filter 72B may be large. More specifically, the inductance of the seventh inductor LH7 is larger than the inductance of each of the first inductor LH1 to the sixth inductor LH6. In short, the inductance of at least one of the fourth inductor L4 of the first filter 71B and the seventh inductor LH7 of the second filter 72B need only be large.

Example Embodiment 10

Figure 29:
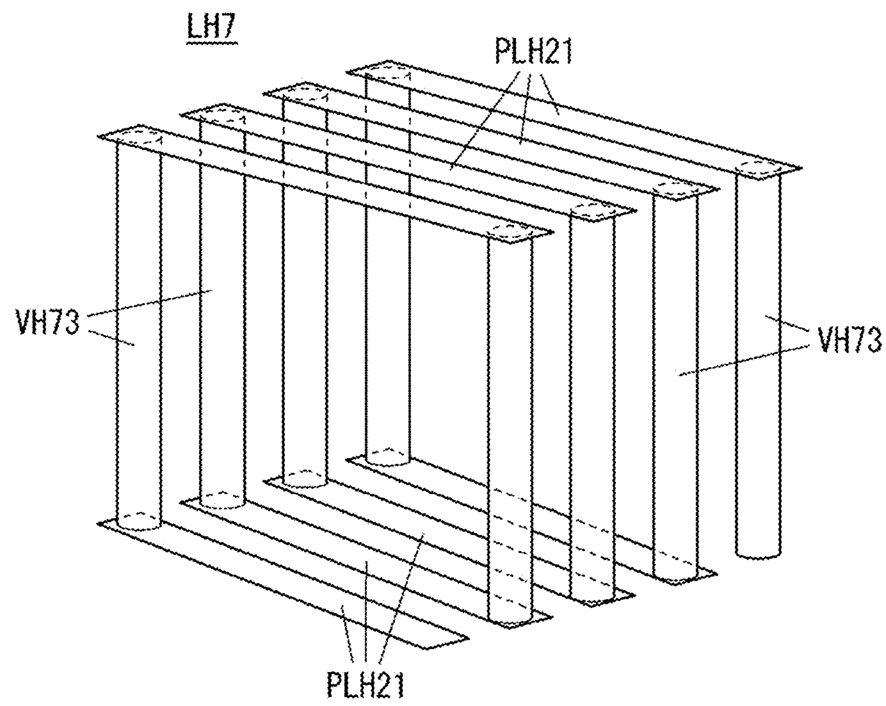
FIG. 29 is a perspective view of a main portion of a multiplexer according to Example Embodiment 10 of the present invention.

A multiplexer 7B according to Example Embodiment 10 of the present invention is different from the multiplexer 7B according to Example Embodiment 7 in that the seventh inductor LH7 of the second filter 72B is a coil including a plurality of turns (in the illustrated example, four turns) as illustrated in FIG. 29. Regarding the multiplexer 7B according to Example Embodiment 10, the same or corresponding components as the components of the multiplexer 7B according to Example Embodiment 7 are designated by the same reference numerals, and the description thereof will be omitted.

(1) Configuration

In the multiplexer 7B according to Example Embodiment 10, the seventh inductor LH7 of the second filter 72B is the coil including the plurality of turns as illustrated in FIG. 29. The seventh inductor LH7 includes a plurality of (in the illustrated example, eight) inductor pattern portions PLH21 and a plurality of (in the illustrated example, eight) inductor vias VH73.

The inductor pattern portions PLH21 of half of the plurality of inductor pattern portions PLH21 are provided in one dielectric layer (not illustrated) among the plurality of dielectric layers of the multilayer body 2. The remaining inductor pattern portions PLH21 are provided in one dielectric layer (not illustrated) different from the above-described dielectric layer among the plurality of dielectric layers of the multilayer body 2.

The plurality of inductor vias VH73 are provided between two dielectric layers in which the plurality of inductor pattern portions PLH21 are provided, in the lamination direction of the multilayer body 2. Each of the inductor vias VH73 is connected to two inductor pattern portions PLH21.

(2) Advantageous Effects

With the multiplexer 7B according to Example Embodiment 10, it is easy to increase the inductance of the seventh inductor LH7.

As a modified example of Example Embodiment 10, the seventh inductor LH7 of the second filter 72B is not limited to the coil including the plurality of turns, and may be a coil including one turn. In short, the seventh inductor LH7 need only be the coil including one or more turns. As a result, the inductance of the seventh inductor LH7 can be increased as compared with the configuration with the inductor via.

The fifth inductor L5 of the first filter 71B may be the coil including the plurality of turns as illustrated in FIG. 29, or may be a coil including one turn. In short, the fifth inductor L5 of the first filter 71B need only be the coil including one or more turns. As a result, the inductance of the fifth inductor L5 can be increased as compared with the configuration with the inductor via.

Figure 30:
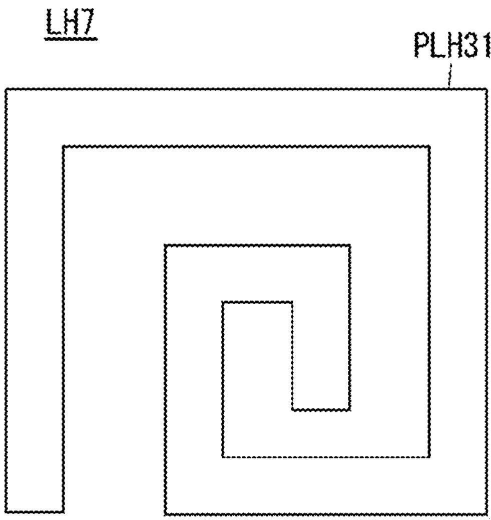
FIG. 30 is a plan view of a main portion of a multiplexer according to a modified example of Example Embodiment 10 of the present invention.

In addition, as another modified example of Example Embodiment 10, the seventh inductor LH7 of the second filter 72B may be a spiral coil as illustrated in FIG. 30. The seventh inductor LH7 includes an inductor pattern portion PLH31. As a result, the inductance of the seventh inductor LH7 can be increased as compared with the configuration with the inductor via.

The fifth inductor L5 of the first filter 71B may be a spiral coil as illustrated in FIG. 30. As a result, the inductance of the fifth inductor L5 can be increased as compared with the configuration with the inductor via.

Example Embodiment 11

A multiplexer 7B (see FIG. 25) according to Example Embodiment 11 of the present invention is different from the multiplexer 7B according to Example Embodiment 7 in that a proportion of the inductance to the capacitance in the second filter 72B is larger than a proportion of the inductance to the capacitance in the first filter 71B. Regarding the multiplexer 7B according to Example Embodiment 11, the same or corresponding components as the components of the multiplexer 7B according to Example Embodiment 7 are designated by the same reference numerals, and the description thereof will be omitted.

In the multiplexer 7B according to Example Embodiment 11, the proportion of the inductance of the seventh inductor LH7 to the capacitance of the seventh capacitor CH7 in the second filter 72B is larger than the proportion of the inductance of the fourth inductor L4 to the capacitance of the first capacitor C1 in the first filter 71B. As a result, the branching of the first filter 71B and the second filter 72B can be successfully performed.

Example Embodiment 12

Figure 31:
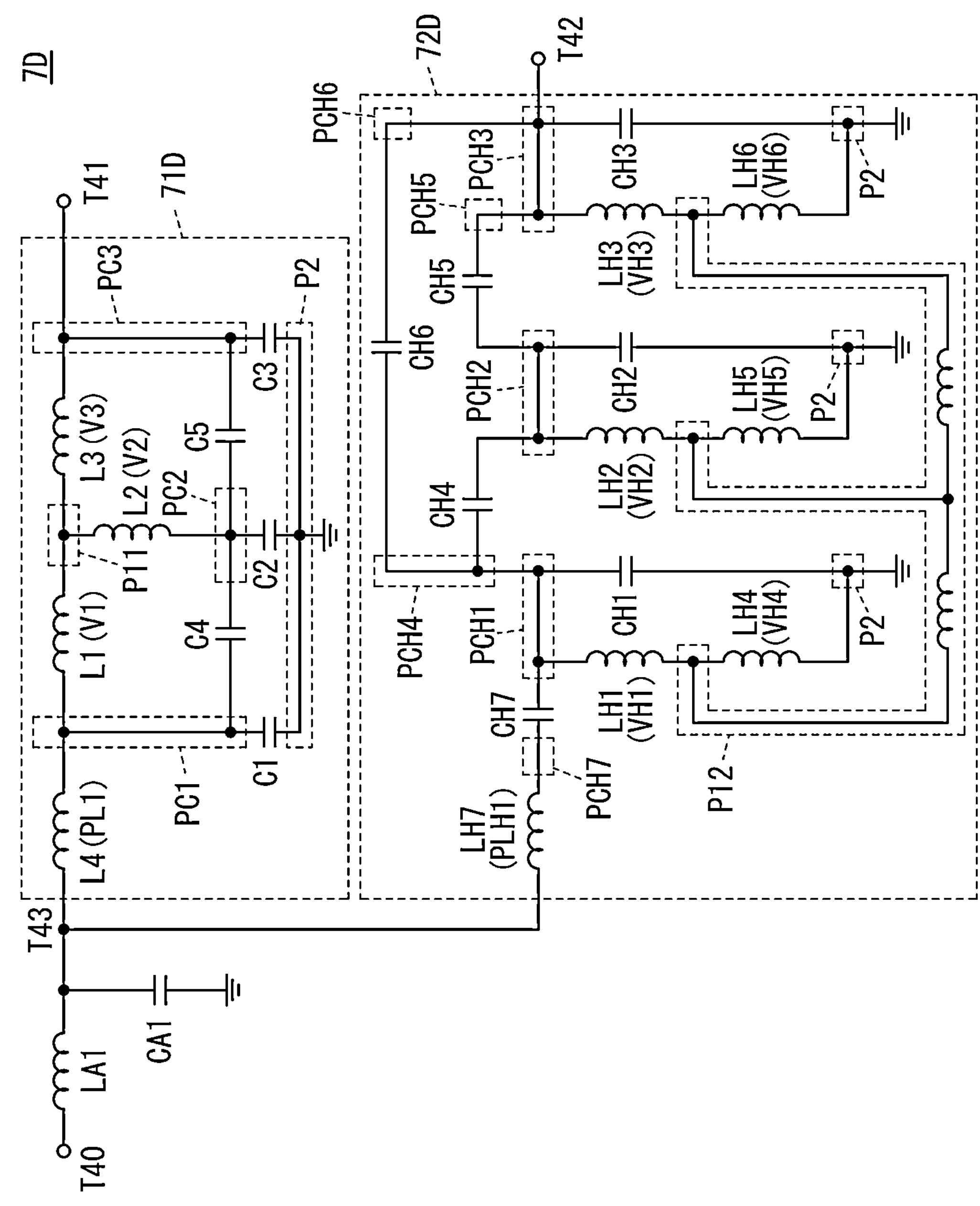
FIG. 31 is a circuit diagram of a multiplexer according to Example Embodiment 12 of the present invention.

A multiplexer 7D according to Example Embodiment 12 of the present invention is different from the multiplexer 7B (see FIG. 25) according to Example Embodiment 9 in that the multiplexer 7D includes an inductor LA1 and a capacitor CA1 as illustrated in FIG. 31. Regarding the multiplexer 7D according to Example Embodiment 12, the same or corresponding components as the components of the multiplexer 7B according to Example Embodiment 9 are designated by the same reference numerals, and the description thereof will be omitted.

(1) Circuit Configuration of Multiplexer

The multiplexer 7D according to Example Embodiment 12 includes the inductor LA1 and the capacitor CA1 as illustrated in FIG. 31. In addition, the multiplexer 7D includes a first filter 71D and a second filter 72D, as in the multiplexer 7B according to Example Embodiment 7.

The inductor LA1 is connected between the common terminal T40 and the branch point T43. The branch point T43 is a branch point between the first filter 71D and the second filter 72D. The inductor LA1 is defined, for example, an inductor via.

The capacitor CA1 is connected between a path between the common terminal T40 and the branch point T43, and a ground. More specifically, the capacitor CA1 is connected to a path between the path between the inductor LA1 and the branch point T43, and the ground. The capacitor CA1 includes, for example, two capacitor electrodes.

(2) Advantageous Effects

Also in the multiplexer 7D according to Example Embodiment 12, as in the multiplexer 7B according to Example Embodiment 9, steep attenuation characteristics can be obtained. As a result, the characteristics of the multiplexer 7B can be improved.

(3) Modified Example

As a modified example of Example Embodiment 12, the multiplexer 7D may include only the inductor LA1, instead of both the inductor LA1 and the capacitor CA1. Alternatively, the multiplexer 7D may include only the capacitor CA1. In short, the multiplexer 7D need only include at least one of the inductor and the capacitor.

Example embodiments and modified examples described above are merely a portion of various example embodiments and modified examples of the present invention.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC filter comprising:

a multilayer body including a plurality of dielectric layers that are laminated;

a first input/output port provided in the multilayer body;

a second input/output port provided in the multilayer body and different from the first input/output port;

a first electrode having a plate shape and provided in a first dielectric layer among the plurality of dielectric layers;

a second electrode having a plate shape and provided in a second dielectric layer different from the first dielectric layer among the plurality of dielectric layers;

a first capacitor electrode defining a first capacitor with the second electrode;

a second capacitor electrode defining a second capacitor with the second electrode;

a third capacitor electrode defining a third capacitor with the second electrode;

a first inductor via including a first end connected to the first capacitor electrode, and a second end connected to the first electrode, and defining a first inductor;

a second inductor via including a third end connected to the second capacitor electrode, and a fourth end connected to the first electrode, and defining a second inductor;

a third inductor via including a fifth end connected to the third capacitor electrode, and a sixth end connected to the first electrode, and defining a third inductor; and a first inductor pattern portion defining a fourth inductor; wherein the first capacitor electrode and the second capacitor electrode define a fourth capacitor;

the second capacitor electrode and the third capacitor electrode define a fifth capacitor;

the first inductor pattern portion includes a first end connected to at least one of the first electrode, the first inductor via, and the first capacitor electrode, and a second end connected to the first input/output port; and the first capacitor electrode and the third capacitor electrode do not face each other.

2. The LC filter according to claim 1, wherein an inductance of the first inductor pattern portion is larger than an inductance of each of the first inductor via, the second inductor via, and the third inductor via.

3. The LC filter according to claim 1, wherein the first inductor pattern portion is wound on a plane in at least one of the plurality of dielectric layers.

4. The LC filter according to claim 3, wherein the first inductor pattern portion is laminated and wound in at least two of the plurality of dielectric layers.

5. The LC filter according to claim 1, further comprising:

a second inductor pattern portion defining a fifth inductor; wherein the second inductor pattern portion includes a third end connected to at least one of the first electrode, the third inductor via, and the third capacitor electrode, and a fourth end connected to the second input/output port.

6. The LC filter according to claim 5, wherein an inductance of the second inductor pattern portion is larger than an inductance of each of the first inductor via, the second inductor via, and the third inductor via.

7. The LC filter according to claim 5, wherein the second inductor pattern portion is wound on a plane in at least one of the plurality of dielectric layers.

8. The LC filter according to claim 7, wherein the second inductor pattern portion is laminated and wound in at least two of the plurality of dielectric layers.

9. The LC filter according to claim 5, wherein the third inductor via includes:

a first portion via connected to the first electrode and the second inductor pattern portion; and a second portion via connected to the third capacitor electrode and the second inductor pattern portion.

10. The LC filter according to claim 1, wherein the first inductor pattern portion is provided between the first electrode and the second electrode in a lamination direction of the plurality of dielectric layers in the multilayer body.

11. The LC filter according to claim 10, wherein the first inductor pattern portion is provided between the first electrode and the first capacitor electrode in the lamination direction of the multilayer body.

12. The LC filter according to claim 11, wherein the second capacitor electrode includes:

a first portion facing the first capacitor electrode; and a second portion facing the third capacitor electrode; and the first inductor pattern portion is provided between the first electrode and the first portion of the second capacitor electrode in the lamination direction of the multilayer body.

13. The LC filter according to claim 1, wherein:

the first inductor via includes:

a first portion via connected to the first electrode and the first inductor pattern portion; and a second portion via connected to the first capacitor electrode and the first inductor pattern portion.

14. The LC filter according to claim 1, wherein the first capacitor electrode, the second capacitor electrode, and the third capacitor electrode are provided between the first electrode and the second electrode in a lamination direction of the plurality of dielectric layers in the multilayer body.

15. The LC filter according to claim 1, wherein each of the first inductor via, the second inductor via, and the third inductor via includes at least one via conductor; and a number of via conductors of each of the second inductor via and the third inductor via is larger than a number of via conductors of the first inductor via.

16. The LC filter according to claim 1, wherein the plurality of dielectric layers include a ceramic.

17. The LC filter according to claim 1, wherein the LC filter defines and functions as a low pass filter to allow a signal in a frequency band lower than a specific frequency to pass through the low pass filter.

18. A multiplexer comprising:

a filter including the LC filter according to claim 1; and a second filter to allow a signal in a frequency band higher than a pass band of the first filter to pass through the second filter.

19. A high frequency module comprising:

a filter including the LC filter according to claim 1; and an amplifier.

20. A communication device comprising:

the high frequency module according to claim 19; and a signal processing circuit.

21. A multiplexer comprising:

a first filter defining a low pass filter;

a second filter to allow a signal in a frequency band higher than a pass band of the first filter to pass through the second filter; and a multilayer body including a plurality of dielectric layers that are laminated; wherein the first filter includes:

a first electrode provided in a first dielectric layer among the plurality of dielectric layers;

a second electrode provided in a second dielectric layer different from the first dielectric layer among the plurality of dielectric layers, and is a ground electrode;

a first capacitor electrode defining a first capacitor with the second electrode;

a second capacitor electrode defining a second capacitor with the second electrode;

a third capacitor electrode defining a third capacitor with the second electrode;

a first inductor via including a first end connected to the first capacitor electrode, and a second end connected to the first electrode, and defining a first inductor;

a second inductor via including a third end connected to the second capacitor electrode, and a fourth end connected to the first electrode, and defining a second inductor;

a third inductor via including a fifth end connected to the third capacitor electrode, and a sixth end connected to the first electrode, and defining a third inductor; and a first inductor pattern portion that defines a fourth inductor;

the second filter includes:

a first electrode for the second filter provided in the first dielectric layer among the plurality of dielectric layers, a second electrode for the second filter provided in the second dielectric layer different from the first dielectric layer among the plurality of dielectric layers, and is a ground electrode;

a first capacitor electrode for the second filter defining a first capacitor for the second filter with the second electrode for the second filter;

a second capacitor electrode for the second filter defining a second capacitor for the second filter with the second electrode for the second filter;

a third capacitor electrode for the second filter defining a third capacitor for the second filter with the second electrode for the second filter;

a first inductor via for the second filter connected between the first capacitor electrode for the second filter and the first electrode for the second filter, and defining a first inductor for the second filter;

a second inductor via for the second filter connected between the second capacitor electrode for the second filter and the first electrode for the second filter, and defining a second inductor for the second filter;

a third inductor via for the second filter connected between the third capacitor electrode for the second filter and the first electrode for the second filter, and defining a third inductor for the second filter;

a fourth inductor via for the second filter connected between the first electrode for the second filter and the second electrode for the second filter, and defining a fourth inductor for the second filter connected in series to the first inductor for the second filter;

a fifth inductor via for the second filter connected between the first electrode for the second filter and the second electrode for the second filter, and defining a fifth inductor for the second filter connected in series to the second inductor for the second filter; and a sixth inductor via for the second filter connected between the first electrode for the second filter and the second electrode for the second filter, and defining a sixth inductor for the second filter connected in series to the third inductor for the second filter, and at least one of the fourth inductor via for the second filter, the fifth inductor via for the second filter, and the sixth inductor via for the second filter is disposed in a boundary region between the first filter and the second filter.

22. The multiplexer according to claim 21, wherein all of the fourth inductor via for the second filter, the fifth inductor via for the second filter, and the sixth inductor via for the second filter are disposed in the boundary region.

23. The multiplexer according to claim 21, wherein a plurality of open-end vias including the first inductor via for the second filter, the second inductor via for the second filter, and the third inductor via for the second filter are provided in a staggered arrangement;

a plurality of short-circuit end vias including the fourth inductor via for the second filter, the fifth inductor via for the second filter, and the sixth inductor via for the second filter are provided in a staggered arrangement; and a number of the short-circuit end vias is larger than the number of the open-end vias in the boundary region.

24. The multiplexer according to claim 21, wherein the first filter and the second filter are connected to a common ground terminal.

25. The multiplexer according to claim 21, further comprising:

a common port provided in the multilayer body; wherein the second filter includes a seventh inductor for the second filter connected between the common port and the first capacitor for the second filter;

an inductance of the fourth inductor of the first filter is larger than an inductance of each of the first inductor, the second inductor, and the third inductor; and an inductance of the seventh inductor for the second filter of the second filter is larger than an inductance of each of the first inductor for the second filter, the second inductor for the second filter, the third inductor for the second filter, the fourth inductor for the second filter, the fifth inductor for the second filter, and the sixth inductor for the second filter.

26. The multiplexer according to claim 25, wherein the second filter further includes a series capacitor for the second filter that is connected between the seventh inductor for the second filter and the first capacitor for the second filter.

27. The multiplexer according to claim 25, wherein at least one of the fourth inductor of the first filter and the seventh inductor for the second filter is defined by a helical coil including one or more turns; and a layer-to-layer distance of the helical coil is about 50 μm or more.

28. The multiplexer according to claim 25, wherein at least one of the fourth inductor of the first filter and the seventh inductor for the second filter is defined by a coil including an inductor via and a pattern portion, or a spiral coil.

29. The multiplexer according to claim 25, wherein the second filter further includes a series capacitor for the second filter connected between the seventh inductor for the second filter and the first capacitor for the second filter; and a proportion of the inductance of the seventh inductor for the second filter to a capacitance of the series capacitor for the second filter in the second filter is larger than a proportion of the inductance of the fourth inductor to a capacitance of the first capacitor in the first filter.

30. The multiplexer according to claim 25, further comprising at least one of an inductor and a capacitor that are connected to a path between a branch point between the first filter and the second filter, and the common port.

* * * * *